United States Patent
Song et al.

(10) Patent No.: US 10,910,598 B2
(45) Date of Patent: Feb. 2, 2021

(54) LIGHTING APPARATUS USING ORGANIC LIGHT EMITTING DIODE AND MANUFACTURING METHOD THEREOF

(71) Applicant: LG Display Co., Ltd., Seoul (KR)

(72) Inventors: TaeJoon Song, Paju-si (KR); Seunghyun Youk, Paju-si (KR); Youngkyun Moon, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 12 days.

(21) Appl. No.: 16/513,648

(22) Filed: Jul. 16, 2019

(65) Prior Publication Data
US 2020/0035948 A1    Jan. 30, 2020

(30) Foreign Application Priority Data
Jul. 25, 2018    (KR) .................. 10-2018-0086401

(51) Int. Cl.
| | | |
|---|---|---|
| *H01L 51/52* | (2006.01) | |
| *H01L 51/56* | (2006.01) | |
| *H01L 51/00* | (2006.01) | |
| *H01L 51/50* | (2006.01) | |

(52) U.S. Cl.
CPC ...... *H01L 51/5256* (2013.01); *H01L 51/0005* (2013.01); *H01L 51/508* (2013.01); *H01L 51/5064* (2013.01); *H01L 51/5092* (2013.01); *H01L 51/5096* (2013.01); *H01L 51/5206* (2013.01); *H01L 51/5221* (2013.01); *H01L 51/56* (2013.01)

(58) Field of Classification Search
None
See application file for complete search history.

(56) References Cited

U.S. PATENT DOCUMENTS

| | | | | |
|---|---|---|---|---|
| 2013/0248891 A1* | 9/2013 | Kim | ............... | H01L 51/5221 257/88 |
| 2014/0159002 A1* | 6/2014 | Lee | ............... | H01L 51/5256 257/40 |
| 2014/0346473 A1* | 11/2014 | Park | ............... | H01L 51/5253 257/40 |
| 2015/0214504 A1* | 7/2015 | Sonoda | ............... | H05B 33/10 257/40 |
| 2016/0118457 A1* | 4/2016 | Kim | ............... | H01L 29/7869 257/40 |

FOREIGN PATENT DOCUMENTS

KR    10-2011-0079500    7/2011

* cited by examiner

*Primary Examiner* — Khaja Ahmad
(74) *Attorney, Agent, or Firm* — Polsinelli PC

(57) ABSTRACT

A lighting apparatus using an organic light emitting diode that has a first area and a second area, the lighting apparatus comprises a substrate; a barrier layer disposed on the substrate; an auxiliary line disposed in the first area on the substrate; a first electrode disposed on an entire surface of the substrate; an organic layer disposed on the first electrode; and a second electrode disposed on the organic layer, wherein the barrier layer includes a first inorganic barrier layer, an organic barrier pattern disposed in the second area, and a second inorganic barrier layer.

15 Claims, 27 Drawing Sheets

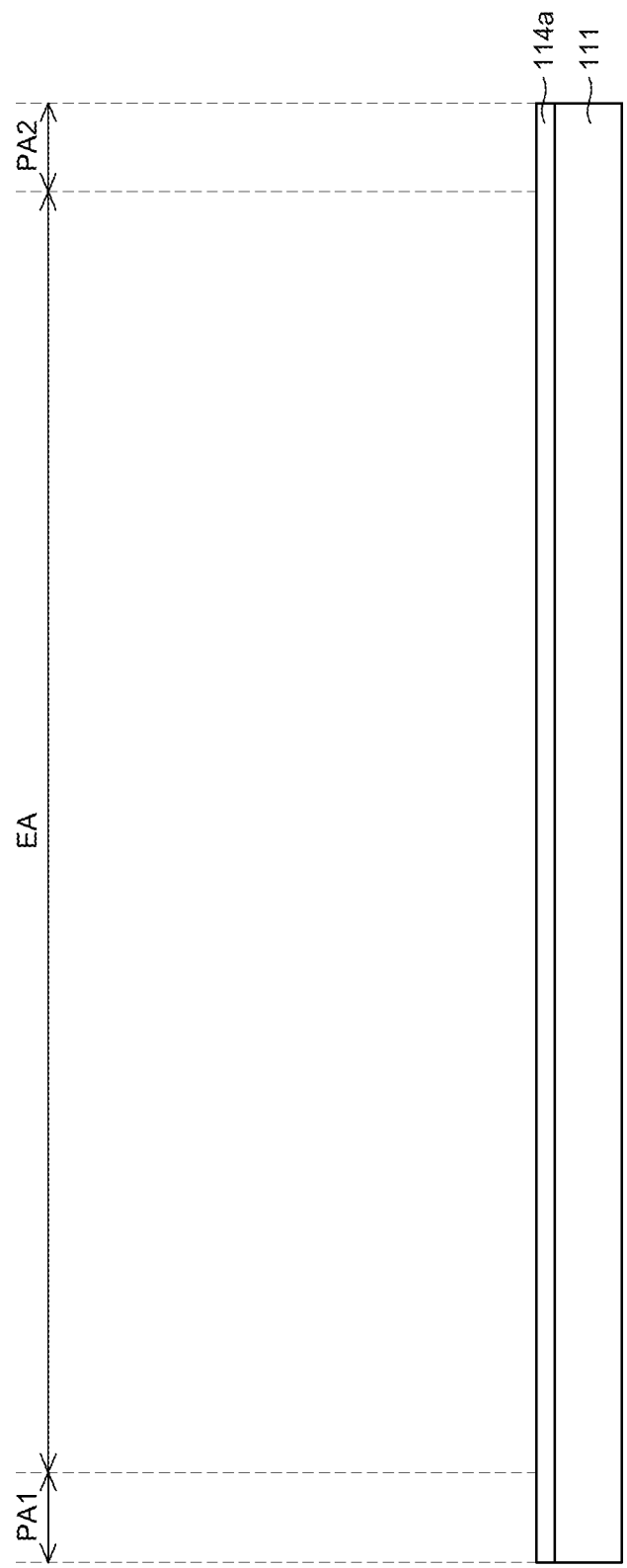

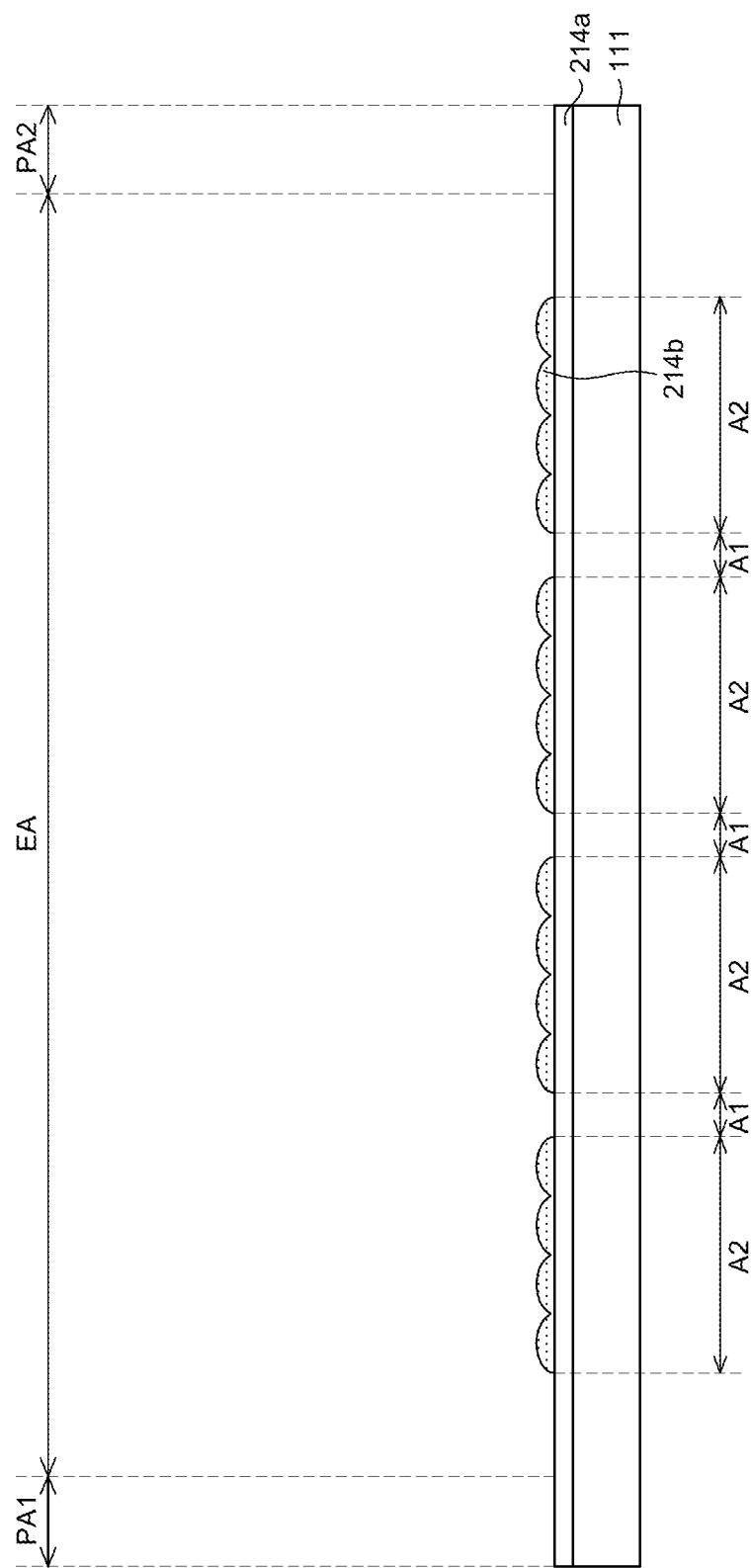

LIGHTING APPARATUS USING ORGANIC LIGHT EMITTING DIODE AND MANUFACTURING METHOD THEREOF

CROSS-REFERENCE TO RELATED APPLICATION

This application claims the priority of Korean Patent Application No. 10-2018-0086401 filed on Jul. 25, 2018, in the Korean Intellectual Property Office, which is incorporated by reference in its entirety.

BACKGROUND

Field of the Disclosure

The present disclosure relates to a lighting apparatus using an organic light emitting diode, and more particularly, to a lighting apparatus using an organic light emitting diode with improved reliability.

Description of the Background

Currently, fluorescent lamps or incandescent lamps are mainly used as lighting apparatuses. Among them, the incandescent lamps have a good color rendering index (CRI) but have very low energy efficiency. Further, the fluorescent lamps have good efficiency, but have a low color rendering index and contain mercury, which may cause an environmental problem.

The color rendering index is an index representing color reproduction. In other words, the color rendering index represents how much a feeling of a color of an object illuminated by a specific light source is similar to a feeling of a color of the object illuminated by a reference light source. A CRI of sunlight is 100.

In order to solve the problems of the lighting apparatus of the related art, recently, a light emitting diode (LED) is suggested as a lighting apparatus. The light emitting diode is configured by an inorganic light emitting material. Luminous efficiency of the light emitting diode is the highest in the red wavelength range and the luminous efficiency thereof is lowered toward a blue wavelength range and a green wavelength range which has the highest visibility. Therefore, there is a disadvantage in that when a red light emitting diode, a green light emitting diode, and a blue light emitting diode are combined to emit white light, the luminous efficiency is lowered.

As another alternative, a lighting apparatus using an organic light emitting diode (OLED) has been developed. The organic light emitting diode is configured by an anode, a plurality of organic layers, and a cathode which are sequentially formed on a substrate.

The plurality of organic layers included in the organic light emitting diode is vulnerable to moisture so that when moisture penetrates onto the organic layer from the outside, cell shrinkage is caused in the organic layer. Therefore, the reliability of the organic light emitting diode is degraded.

SUMMARY

An object to be achieved by the present disclosure is to provide a lighting apparatus using an organic light emitting diode which suppresses the penetration of moisture from the outside and a manufacturing method thereof.

Another object to be achieved by the present disclosure is to provide a lighting apparatus using an organic light emitting diode which includes a barrier layer with a plurality of organic barrier patterns and a manufacturing method thereof.

Objects of the present disclosure are not limited to the above-mentioned objects, and other objects, which are not mentioned above, can be clearly understood by those skilled in the art from the following descriptions.

In order to solve the above-described problems, according to an aspect of the present disclosure, a lighting apparatus using an organic light emitting diode is divided into a first area and a second area and includes: a substrate; a barrier layer disposed on the substrate; an auxiliary line disposed in a first area on the substrate on which the barrier layer is disposed; a first electrode disposed on an entire surface of the substrate on which the barrier layer and the auxiliary line are disposed; an organic layer disposed on the first electrode; and a second electrode disposed on the organic layer, in which the barrier layer includes a first inorganic barrier layer, an organic barrier pattern disposed in the second area, and a second inorganic barrier layer. Therefore, the reliability of the lighting apparatus may be improved.

In order to solve the above-described problems, according to another aspect of the present disclosure, a manufacturing method of a lighting apparatus using an organic light emitting diode includes: providing a substrate which is divided into a first area and a second area; depositing a first inorganic barrier layer on the substrate; forming an organic barrier pattern in the second area on the substrate on which the first inorganic barrier layer is deposited; depositing a second inorganic barrier layer on an entire surface of the substrate on which the organic barrier pattern is formed; forming an auxiliary line in the first area on the substrate on which the second inorganic barrier layer is deposited; forming a first electrode on an entire surface of the substrate on which the second inorganic barrier layer and the auxiliary line are disposed; depositing an organic layer on an entire surface of the substrate on which the first electrode is formed; and depositing a second electrode on an entire surface of the substrate on which the organic layer is formed. Therefore, it is possible to manufacture a lighting apparatus with an improved external moisture-proofing function.

Other detailed matters of the exemplary disclosures are included in the detailed description and the drawings.

According to the present disclosure, a plurality of organic barrier patterns is disposed in a specific area to suppress the moisture penetration from the outside, thereby improving the reliability of the lighting apparatus.

According to the present disclosure, the organic barrier pattern is formed to have an island shape, so that all moisture penetrating paths are blocked to suppress the cell shrinkage of the organic light emitting diode.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which:

FIGS. 5A to 5J are plan views sequentially illustrating a manufacturing method of a lighting apparatus using an organic light emitting diode according to an exemplary disclosure of the present disclosure illustrated in FIG. 4;

FIGS. 7A to 7J are plan views sequentially illustrating a manufacturing method of a lighting apparatus using an organic light emitting diode according to another exemplary disclosure of the present disclosure illustrated in FIG. 6.

DETAILED DESCRIPTION

Figure 1:
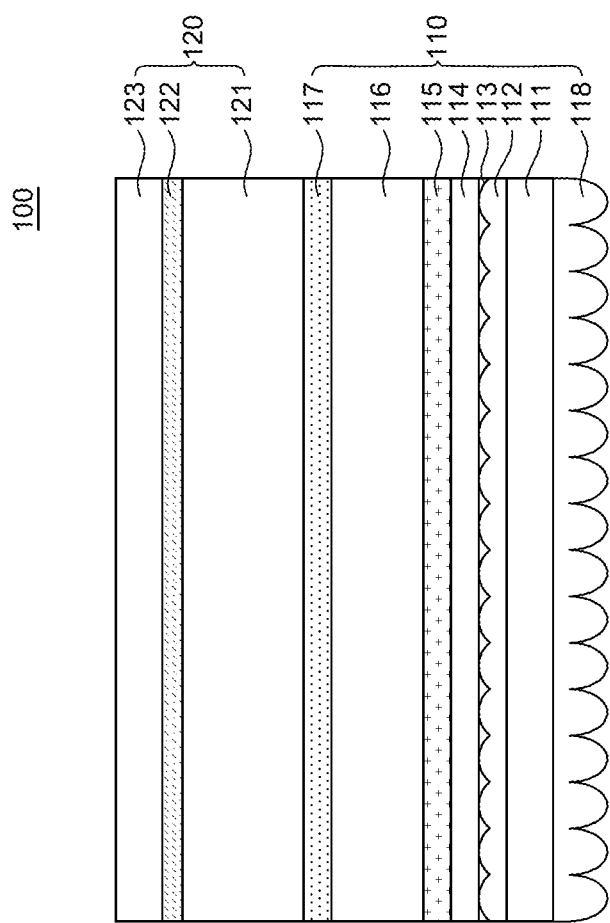
FIG. 1 is a cross-sectional view illustrating a lighting apparatus using an organic light emitting diode according to an exemplary disclosure of the present disclosure.

Advantages and characteristics of the present disclosure and a method of achieving the advantages and characteristics will be clear by referring to exemplary disclosures described below in detail together with the accompanying drawings. However, the present disclosure is not limited to the exemplary disclosures disclosed herein but will be implemented in various forms. The exemplary disclosures are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary disclosures of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various disclosures of the present disclosure can be partially or entirely adhered to or combined with each other and can be interlocked and operated in technically various ways, and the disclosures can be carried out independently of or in association with each other.

Hereinafter, a lighting apparatus using an organic light emitting diode according to exemplary disclosures of the present disclosure will be described in detail with reference to accompanying drawings.

FIG. 1 is a cross-sectional view illustrating a lighting apparatus using an organic light emitting diode according to an exemplary disclosure of the present disclosure.

In the present disclosure, provided is a lighting apparatus using an organic light emitting diode formed of an organic material, rather than a lighting apparatus using an inorganic light emitting diode formed of an inorganic material.

Luminous efficiency of green and red of the organic light emitting diode formed of an organic light emitting material is relatively better than that of an inorganic light emitting diode. Further, the organic light emitting diode has a relatively wider width of an emission peak of red, green, and blue as compared with the inorganic light emitting diode, so that the color rendering index (CRI) is improved so that the light of the lighting apparatus is more similar to the sunlight.

Referring to FIG. 1, a lighting apparatus 100 using an organic light emitting diode according to an exemplary disclosure of the present disclosure includes an organic light emitting diode unit 110 which performs surface emission and an encapsulating unit 120 which encapsulates the organic light emitting diode unit 110.

Specifically, the organic light emitting diode unit 110 may sequentially include a substrate 111, an internal light extracting layer 112, a planarizing layer 113, a barrier layer 114, a first electrode 115, an organic layer 116, and a second electrode 117 from the lower side.

An external light extracting layer 118 for increasing a haze may be additionally provided below the organic light emitting diode unit 110. However, the present disclosure is not limited thereto and the lighting apparatus 100 of the present disclosure may not include the external light extracting layer. Here, the external light extracting layer 118 is configured such that scattering particles such as TiO2 are dispersed in a resin and may be attached below a substrate 111 by means of an adhesive layer (not illustrated).

In addition, as it will be described below with reference to FIGS. 3B and 4, the organic light emitting diode unit 110 may further include an auxiliary line AL for compensating a conductivity of the first electrode 115 and an insulating layer INS for suppressing the short of the first electrode 115 and the second electrode 117.

The substrate 111 may be configured by transparent glass. Further, the substrate 111 may be configured by a polymer material having flexibility such as polyimide.

Here, the organic layer 116 which emits light and the first electrode 115 and the second electrode 117 which are disposed on and below the organic layer 116 to supply charges to the organic layer 116 may form an organic light emitting diode (OLED).

For example, the first electrode 115 may be an anode which supplies holes to the organic layer 116 and the second electrode 117 may be a cathode which supplies electrons to the organic layer 116, but are not limited thereto and the functions of the first electrode 115 and the second electrode 117 may be switched.

Generally, the first electrode 115 may be configured by indium tin oxide (ITO) or indium zinc oxide (IZO) which is a transparent metal oxide material having a high work function and good conductivity or a thin metal film to easily inject the holes. Here, a specific example of the thin metal film may refer to a metal such as magnesium (Mg), calcium (Ca), sodium (Na), titanium (Ti), indium (In), yttrium (Y), lithium (Li), gadolinium (Gd), aluminum (Al), silver (Ag), tin (Sn) and lead (Pb), or an alloy thereof. The first electrode 115 may be configured by a single stack or may also be configured by a multi-stack configured by the above-mentioned materials.

Further, the second electrode 117 is desirably configured by a conductive material having a low work function so as to easily inject electrons to the organic layer 116. A specific example of a material used for the second electrode 117 may be configured by a metal such as magnesium (Mg), calcium (Ca), sodium (Na), titanium (Ti), indium (In), yttrium (Y), lithium (Li), gadolinium (Gd), aluminum (Al), silver (Ag), tin (Sn) and lead (Pb), or an alloy thereof. The second electrode 117 may also be configured by the single stack and configured by the multi-stack configured by the above-mentioned materials.

The organic layer 116 may be configured by a single stack structure including a red organic light emitting layer EML or formed to have a multi-stack tandem structure including a plurality of red organic light emitting layers, or a multi-stack tandem structure including a red-green organic light emitting layer EML and a sky blue organic light emitting layer EML.

Further, the organic layer 116 may include an electron injection layer EIL and a hole injection layer HIL which inject electrons and holes to the organic light emitting layer EML, respectively and an electron transport layer ETL and a hole transport layer HTL which transport the injected electrons and holes to the light emitting layer, respectively, and a charge generating layer CGL which generates charges such as the electrons and the holes. A specific structure thereof will be described below with reference to FIGS. 2A to 2C.

When a current is applied to the first electrode 115 and the second electrode 117, the electrons are injected from the second electrode 117 to the organic layer 116 and holes are injected from the first electrode 115 to the organic layer 116. Thereafter, excitons are generated in the organic layer 116. As the excitons are decayed, light corresponding an energy difference of a lowest unoccupied molecular orbital (LUMO) and a highest occupied molecular orbital (HOMO) of the light emitting layer is generated.

Here, it is determined whether the light generated in the organic layer 116 is emitted to the front side or to the rear side depending on transmittance and reflectance of the first electrode 115 and the second electrode 117.

In the exemplary disclosure of the present disclosure, as described above, the first electrode 115 is a transparent electrode and the second electrode 117 is used as a reflective electrode. Therefore, the light emitted from the organic layer 116 is reflected by the second electrode 117 to be transmitted through the first electrode 115 so that the light is generated to the lower portion of the organic light emitting diode unit 110. That is, the organic light emitting diode unit 110 according to an exemplary disclosure of the present disclosure may perform bottom emission. However, the present disclosure is not limited thereto and the first electrode 115 is used as a reflective electrode and the second electrode 117 is used as a transparent electrode so that the organic light emitting diode unit 110 may perform top emission.

Further, the barrier layer 114 is disposed below the first electrode 115 to block moisture, air, or fine particles penetrating from the substrate 111 and the internal light extracting layer 112.

In order to suppress the penetration of moisture and air, the barrier layer 114 may include a plurality of inorganic barrier layers and in order to block the fine particles, the barrier layer 114 may include a plurality of organic barrier patterns.

Specifically, as it will be described below with reference to FIG. 4, the organic barrier pattern 114b according to the present disclosure may be disposed to have an island shape only in a second area A2 which is an area between the auxiliary lines AL excluding a first area A1 in which the auxiliary line AL is disposed. Further, a first inorganic barrier layer 114a, the organic barrier pattern 114b, and a second inorganic barrier layer 114c are sequentially laminated.

Here, the first inorganic barrier layer 114a and the second inorganic barrier layer 114c may be formed to surround the organic barrier pattern 114b. Details thereof will be described below with reference to FIG. 4.

The internal light extracting layer 112 is disposed between the substrate 111 and the barrier layer 114 to increase the external extracting efficiency of the light generated from the organic light emitting diode which performs the bottom emission.

The internal light extracting layer 112 inserts titanium oxide TiO2 particles into resin to increase internal light scattering and increase surface roughness, thereby increasing optical extraction efficiency. Specifically, the internal light extracting layer 112 may be formed to have a thickness of 450 nm by an inkjet-coating method and a diameter of titanium oxide TiO2 particle may be 200 nm to 300 nm. However, the specific value may vary to various values depending on the necessity of the design of the lighting apparatus 100.

The planarizing layer 113 is disposed on the internal light extracting layer 112 to compensate the surface roughness of the internal light extracting layer 112, thereby improving the reliability of the organic light emitting diode unit 110.

The planarizing layer 113 is configured by inserting zirconia particles into resin and compensates the surface roughness of the internal light extracting layer 112. Specifically, the planarizing layer 113 may be formed by the inkjet-coating method to have a thickness of 150 nm and a diameter of the zirconia particle may be 50 nm. However, the specific value may vary to various values depending on the necessity of the design of the lighting apparatus 100.

An encapsulating unit 120 covers the organic light emitting diode unit 110 to protect the organic light emitting diode unit 110 by blocking the influence from the outside. The encapsulating unit 120 includes an adhesive layer 121 which is in contact with the second electrode 117, a metal film 122 which is in contact with the adhesive layer 121, and a protective film 123 attached onto the metal film 122.

The adhesive layer 121 may be configured by a pressure sensitive adhesive (PSA) which bonds the metal film 122 and the organic light emitting diode unit 110. A thickness of the adhesive layer 121 may be 30 □m, but is not limited thereto and may vary to various values depending on the necessity of the design of the lighting apparatus 100.

The metal film 122 is disposed on the adhesive layer 121 to maintain the rigidity of the lighting apparatus 100. To this end, the metal film 122 may be formed of copper (Cu) having a thickness of 20 □m, but is not limited thereto and may vary in various forms depending on the necessity of the design of the lighting apparatus 100.

The protective film 123 is disposed on the metal film 122 to absorb the external impact of the lighting apparatus 100 and protect the lighting apparatus 100. To this end, the protective film 123 may be formed of a polyethylene terephthalate (PET) film which is a polymer film having a thickness of 100 □m, but is not limited thereto and may vary in various forms depending on the necessity of the design of the lighting apparatus 100.

Figure 2A:
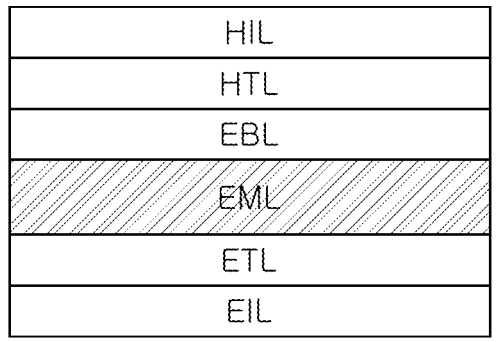
FIGS. 2A to 2C are cross-sectional views illustrating a stack structure of an organic layer according to an exemplary disclosure of the present disclosure.
Figure 2B:
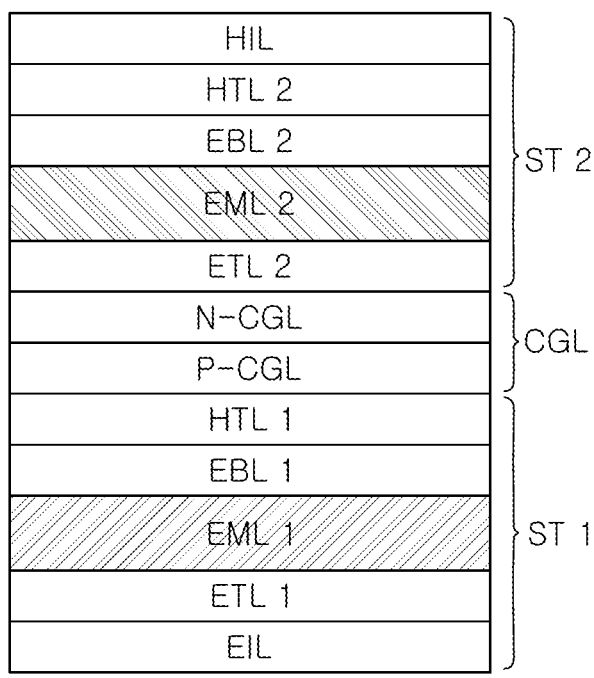
Figure 2C:
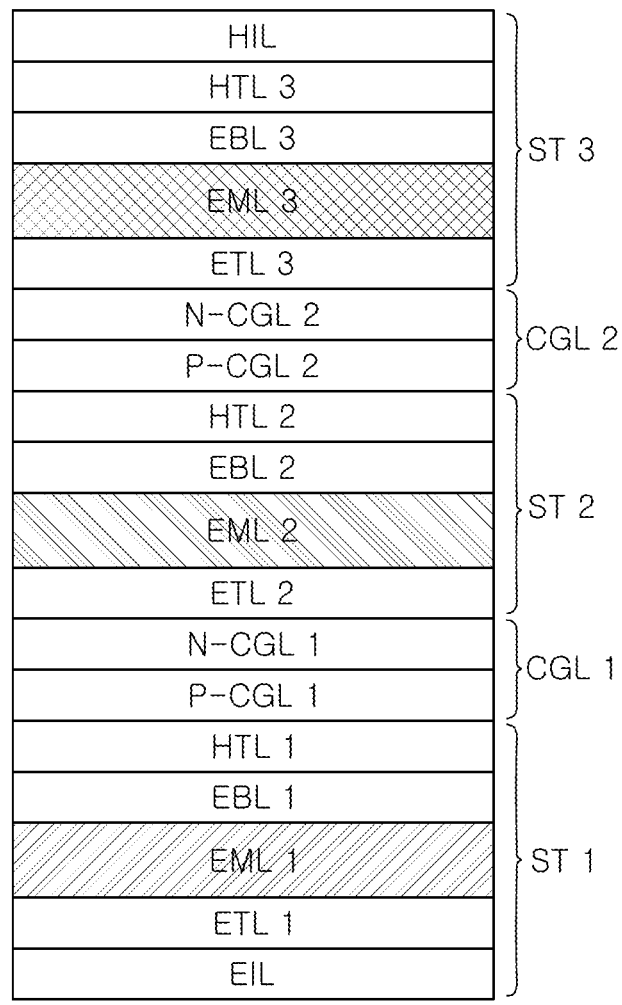

FIGS. 2A to 2C are cross-sectional views illustrating a stack structure of an organic layer according to an exemplary disclosure of the present disclosure.

Specifically, FIG. 2A illustrates an organic layer 116 having a single stack, FIG. 2B illustrates an organic layer 116 having a tandem structure including a double stack, and FIG. 2C illustrates an organic layer 116 having a tandem structure including a triple stack.

Referring to FIG. 2A, the organic layer 116 is configured by a hole injection layer (HIL), a hole transport layer (HTL), an electron blocking layer (EBL), an organic light emitting layer (EML), an electron transport layer (ETL), and an electron injection layer (EIL) which are sequentially laminated.

The hole injection layer HIL is an organic layer which smoothly injects the hole from the first electrode 115 to the organic light emitting layer EML. The hole injection layer HIL may be formed of a material including any one or more of HAT-CN(dipyrazino[2,3-f:2',3'-h]quino xaline-2,3,6,7,10.11-hexacarbonitrile), CuPc(phthalocyanine), F4-TCNQ (2,3,5,6-tetrafluoro-7,7,8,8-tetracyano-quinodimethane), and NPD(N,N'-bis(naphthalene-1-yl)-N,N'-bis(phenyl)-2,2'-dimethylbenzidine), but is not limited thereto.

The hole transport layer HTL is an organic layer which smoothly transmits the holes from the hole injection layer HIL to the organic light emitting layer EML. For example, the hole transport layer HTL may be formed of a material including any one or more of NPD(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine), s-TAD (2,2',7,7'-tetrakis(N,N-dimethylamino)-9,9-spirofluorene), and MTD ATA(4,4',4"-Tris (N-3-methylphenyl-N-phenyl-amino)-triphenylamine), but is not limited thereto.

The electron blocking layer EBL is an organic layer which blocks the electron injected into the organic light emitting layer EML from crossing over the hole transport layer HTL. The electron blocking layer EBL blocks the movement of the electron to improve the combination of the hole and the electron in the organic light emitting layer EML and improve luminous efficiency of the organic light emitting layer EML. Even though the electron blocking layer EBL may be formed of the same material as the hole transport layer HTL, and the hole transport layer HTL and the electron blocking layer EBL may be formed as different layers, it is not limited thereto and the hole transport layer HTL and the electron blocking layer EBL may be combined.

In the organic light emitting layer EML, the holes supplied through the first electrode 115 and the electrons supplied through the second electrode 117 are recombined to generate excitons. Here, an area where the excitons are generated is referred to as an emission area (or emission zone) or a recombination zone.

The organic light emitting layer (EML) is disposed between the hole transport layer HTL and the electron transport layer ETL and includes a material which emits light having a specific color. In this case, the organic light emitting layer EML may include a material which emits red light.

The organic light emitting layer EML may have a host-dopant system, that is, a system in which a host material having a large weight ratio is doped with an emission dopant material having a small weight ratio.

In this case, the organic light emitting layer EML may include a plurality of host materials or include a single host material. The organic light emitting layer EML including a plurality of host materials or a single host material is doped with a red phosphorescent dopant material. That is, the organic light emitting layer EML is a red light emitting layer and a range of a wavelength of light emitted from the organic light emitting layer EML may be 600 nm to 660 nm.

The red phosphorescent dopant material is a material which is capable of emitting red light. An EL spectrum of light emitted from the organic light emitting layer EML doped with the red phosphorescent dopant material has a peak in a red wavelength area or has a peak in a wavelength region corresponding to red.

The red phosphorescent dopant material may be formed of a material including any one or more of a iridium (Ir) ligand complex including Ir(ppy)3(fac tris(2-phenylpyridine)iridium)(tris(2-phenylpyridine)iridium), PIQIr(acac) (bis(1-phenylisoquinoline) acetylacetonate iridium), PQIr (acac)(bis(1-phenylquinoline) acetylacetonate iridium), PQIr(tris (1-phenylquinoline) iridium) Ir(piq)3(tris(1-phenylisoquinoline)iridium), Ir(piq)2(acac)(bis(1-phenylisoquinoline)(acetylacetonate)iridium), PtOEP(octaethylporphyrinporphine platinum) PBD:Eu(DBM)3(Phen), and perylene, but is not limited thereto.

The electron transport layer ETL is supplied with electrons from the electron injection layer EIL. The electron transport layer ETL transmits the supplied electrons to the organic light emitting layer EML.

Further, the electron transport layer ETL performs the same function as a hole blocking layer HBL. The hole blocking layer may suppress the holes which do not participate the recombination from being leaked from the organic light emitting layer EML.

For example, the electron transport layer ETL may be formed of any one or more of Liq(8-hydroxyquinolinolato-lithium), PBD(2-(4-biphenyl)-5-(4-tert-butylphenyl)-1,3,4-oxadiazole), TAZ(3-(4-biphenyl)4-phenyl-5-tert-butylphenyl-1,2,4-triazole), BCP(2,9-Dimethyl-4,7-diphenyl-1,10-phenanthroline), and BAlq(bis(2-methyl-8-quinolinolate)-4-(phenylphenolato)aluminum), but is not limited thereto.

The electron injection layer EIL is a layer which smoothly injects the electron from the second electrode 117 to the organic light emitting layer EML. For example, the electron injection layer EIL may be formed of a material including any one or more of alkali metals or alkaline earth metal ion forms such as LiF, BaF2, and CsF, but is not limited thereto.

The electron injection layer EIL and the electron transport layer ETL may be omitted depending on a structure or a characteristic of the lighting apparatus 100 using an organic light emitting diode.

Referring to FIG. 2B, the organic layer 116 includes a first stack ST1 including a first organic light emitting layer EML1, a second stack ST2 including a second organic light emitting layer EML2, and a charge generating layer CGL disposed between the first stack ST1 and the stack ST2.

Here, the first stack ST1 includes an electron injection layer EIL, a first electron transport layer ETL1, a first organic light emitting layer EML1, a first electron blocking layer EBL1, and a first hole transport layer HTL1. The second stack ST2 includes a second electron transport layer ETL2, a second organic light emitting layer EML2, a second electron blocking layer EBL2, a second hole transport layer HTL2, and a hole injection layer HIL and the function and the configuration of each layer are as described above.

In the meantime, the charge generating layer CGL is disposed between the first stack ST1 and the second stack ST2. The charge generating layer CGL supplies charges to the first stack ST1 and the second stack ST2 to control a charge balance between the first stack ST1 and the second stack ST2.

The charge generating layer CGL includes an N-type charge generating layer N-CGL and a P-type charge generating layer P-CGL. The N-type charge generating layer N-CGL is in contact with the second electron transport layer ETL2 and the P-type charge generating layer P-CGL is disposed between the N-type charge generating layer N-CGL and the first hole transport layer HTL1. The charge generating layer CGL may be configured by a plurality of layers including the N-type charge generating layer N-CGL and the P-type charge generating layer P-CGL, but is not limited thereto and may be configured by a single stack.

The N-type charge generating layer N-CGL injects the electrons to the first stack ST1. The N-type charge generating layer N-CGL may include an N-type dopant material and an N-type host material. The N-type dopant material may be a metal of Group 1 and Group 2 on the periodic table, an organic material which may inject the electrons, or a mixture thereof. For example, the N-type dopant material may be any one of an alkali metal and an alkaline earth metal. That is, the N-type charge generating layer N-CGL may be formed of the organic layer 116 doped with an alkali metal such as lithium (Li), sodium (Na), potassium (K), or cesium (Cs) or an alkali earth metal such as magnesium (Mg), strontium (Sr), barium (Ba), or radium (Ra), but is not limited thereto. The N-type host material may be formed of a material which is capable of transmitting electrons, for example, may be formed of any one or more of Alq3(tris (8-hydroxyquinolino)aluminum), Liq(8-hydroxyquinolino-lato-lithium), PBD(2-(4-biphenylyl)-5-(4-tert-butylphenyl)-1,3,4oxadiazole), TAZ(3-(4-biphenyl)4-phenyl-5-tert-butylphenyl-1,2,4-triazole), spiro-PBD, and BAlq(bis(2-methyl-8-quinolinolate)-4-(phenylphenolato)aluminium), SAlq, TPBi(2,2',2-(1,3,5-benzinetriyl)-tris(1-phenyl-1-H-benzimidazole), oxadiazole, triazole, phenanthroline, benzoxazole, and benzthiazole, but is not limited thereto.

The P-type charge generating layer P-CGL injects the holes to the second stack ST2. The P-type charge generating layer P-CGL may include a P-type dopant material and a P-type host material. The P-type dopant material may be formed of metal oxide, an organic material such as tetrafluoro-tetracyanoquinodimethane (F4-TCNQ), HAT-CN (Hexaazatriphenylene-hexacarbonitrile), or hexaazatriphenylene, or a metal material such as V2O5, MoOx, and WO3, but is not limited thereto. The P-type host material may be formed of a material which is capable of transmitting holes, for example, may be formed of a material including any one or more of NPD(N,N-dinaphthyl-N,N'-diphenyl benzidine)(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine), and MTDATA(4,4',4-Tris(N-3-methylphenyl-N-phenyl-amino)-triphenylamine), but is not limited thereto.

Referring to FIG. 2C, the organic layer 116 includes a first stack ST1 including a first organic light emitting layer EML1, a second stack ST2 including a second organic light emitting layer EML2, a third stack ST3 including a third organic light emitting layer EML3, a first charge generating layer CGL1 disposed between the first stack ST1 and the second stack ST2, and a second charge generating layer CGL2 disposed between the second stack ST2 and the third stack ST3.

Here, the first stack ST1 includes an electron injection layer EIL, a first electron transport layer ETL1, a first organic light emitting layer EML1, a first electron blocking layer EBL1, and a first hole transport layer HTL1. The second stack ST2 includes a second electron transport layer ETL2, a second organic light emitting layer EML2, a second electron blocking layer EBL2, and a second hole transport layer HTL2. The third stack ST3 includes a third electron transport layer ETL3, a third organic light emitting layer EML3, a third electron blocking layer EBL3, a third hole transport layer HTL3, and a hole injection layer HIL. The function and the configuration of each layer are as described above.

The first charge generating layer CGL1 includes a first N-type charge generating layer N-CGL1 and a first P-type charge generating layer P-CGL1, and the first N-type charge generating layer N-CGL1 is in contact with the second electron transport layer ETL2. The first P-type charge generating layer P-CGL1 is disposed between the first N-type charge generating layer N-CGL1 and the first hole transport layer HTL1.

The second charge generating layer CGL2 includes a second N-type charge generating layer N-CGL2 and a second P-type charge generating layer P-CGL2, and the second N-type charge generating layer N-CGL2 is in contact with the third electron transport layer ETL3. The second P-type charge generating layer P-CGL2 is disposed between the second N-type charge generating layer N-CGL2 and the second hole transport layer HTL2. The functions and configurations of the first and second charge generating layers CGL1 and CGL2 are as described above.

Here, the first organic light emitting layer EML1 and the third organic light emitting layer EML3 are red-green organic light emitting layers and a range of a wavelength of light emitted from the first organic light emitting layer EML1 and the third organic light emitting layer EML3 may be 520 nm to 580 nm. The second organic light emitting layer EML2 is a sky blue organic light emitting layer and a range of a wavelength of light emitted from the second organic light emitting layer EML2 may be 450 nm to 480 nm.

Figure 3A:
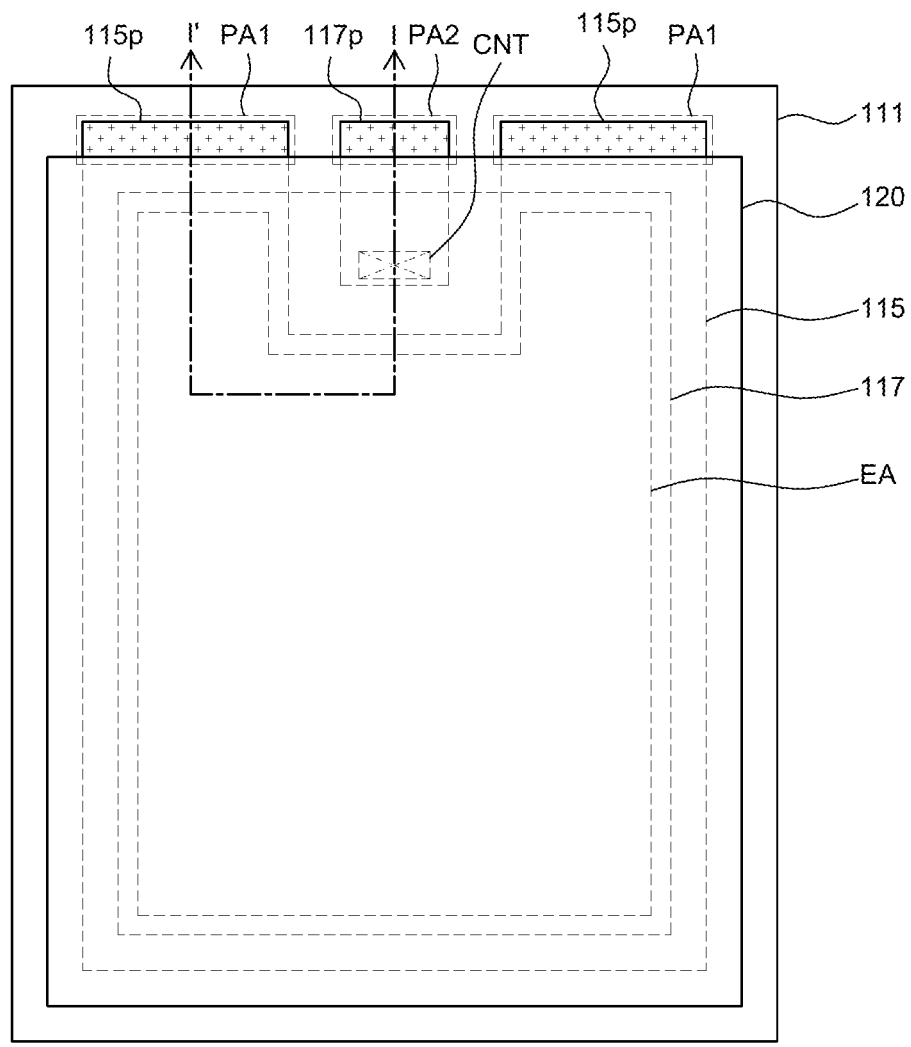
FIG. 3A is a front view of a lighting apparatus using an organic light emitting diode according to an exemplary disclosure of the present disclosure.
Figure 3B:
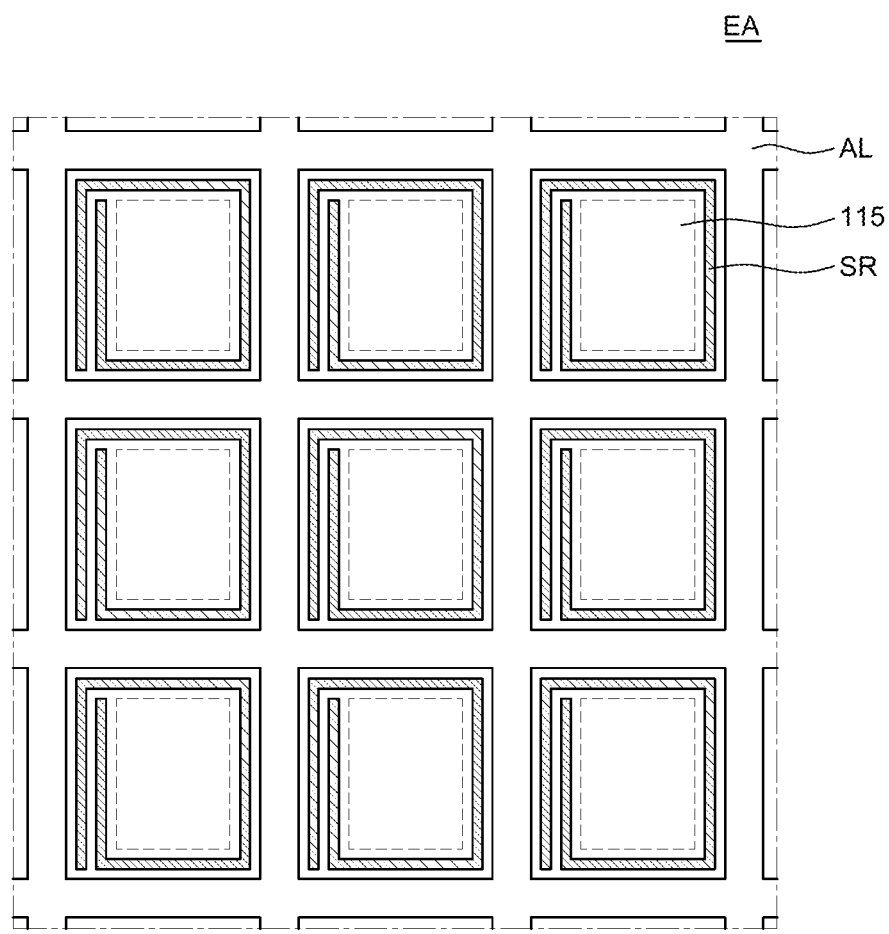
FIG. 3B is an enlarged view of a lighting unit of a lighting apparatus using an organic light emitting diode according to an exemplary disclosure of the present disclosure.

FIG. 3A is a front view of a lighting apparatus using an organic light emitting diode according to an exemplary disclosure of the present disclosure, and FIG. 3B is an enlarged view of a lighting unit of a lighting apparatus using an organic light emitting diode according to an exemplary disclosure of the present disclosure.

Figure 4:
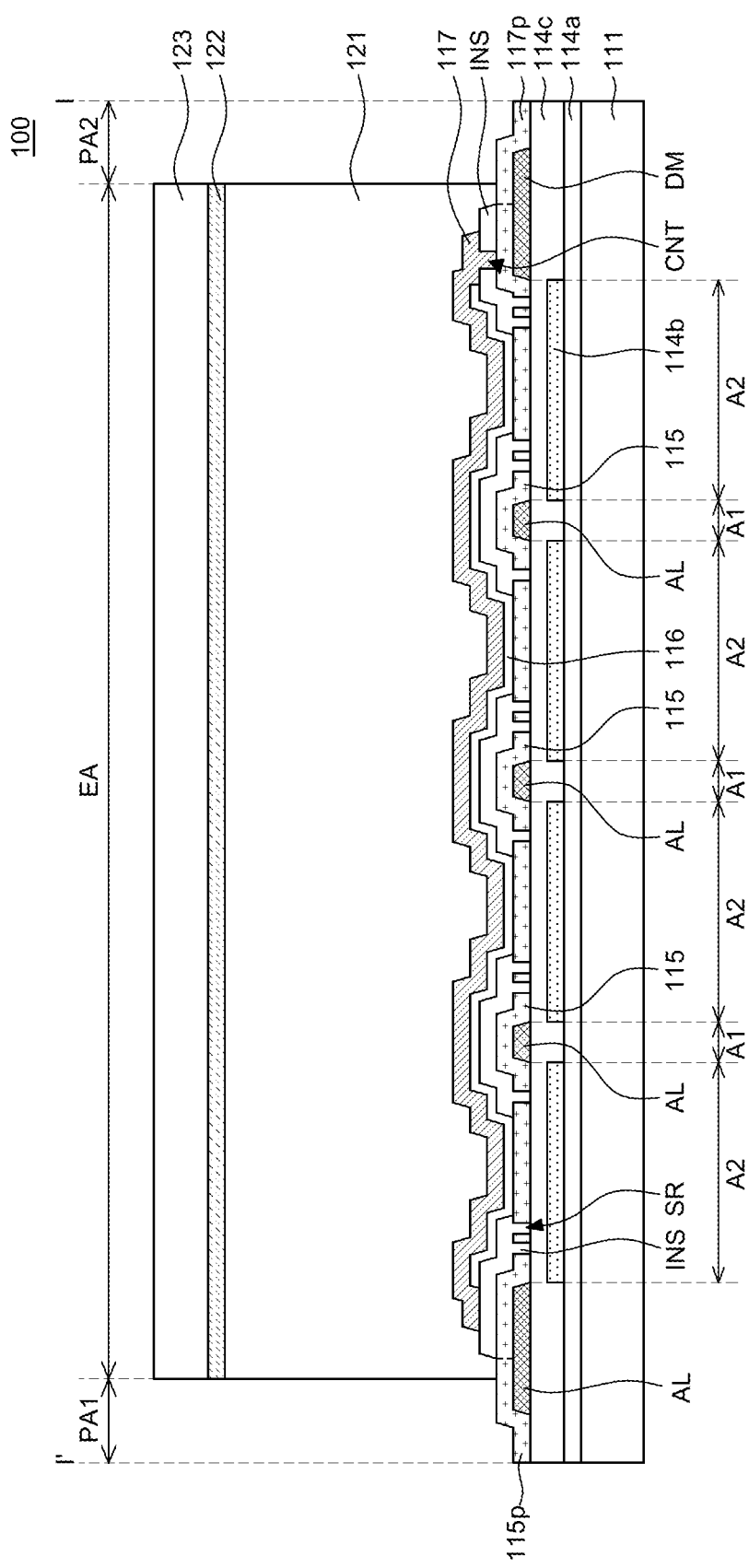
FIG. 4 is a cross-sectional view taken along the line I-I' of FIG. 3A.

FIG. 4 is a cross-sectional view taken along the line I-I' of FIG. 3A.

Specifically, FIG. 3A illustrates an arrangement of the first electrode 115, the second electrode 117, and the encapsulating unit 120. FIG. 4 illustrates not only the connection relationship of the second electrode 117 and the second contact electrode 117p and the connection relationship of the first electrode 115 and the first contact electrode 115p, but also an arrangement of components in the first area A1 and the second area A2.

As illustrated in FIGS. 1, 3A and 4, the first electrode 115 is disposed on the substrate 111, the second electrode 117 is disposed on the first electrode 115, and the encapsulating unit 120 is disposed so as to cover the second electrode 117.

Here, the overlapping area of the first electrode 115 and the second electrode 117 may be defined as a lighting unit EA where light is generated from the organic layer 116 disposed between the first electrode 115 and the second electrode 117.

In other words, the lighting apparatus 100 according to the present disclosure may be divided into a lighting unit EA which actually emits light to the outside and pad units PA1 and PA2 which are electrically connected to the outside through the first and second contact electrodes 115p and 117p to apply a signal to the lighting unit EA.

The pad units PA1 and PA2 are not blocked by the encapsulation unit such as a metal film 122 so that the pad units PA1 and PA2 may be electrically connected to the outside through the first and second contact electrodes 115p and 117p. Therefore, the metal film 122 may be attached onto the entire surface of the lighting unit EA of the substrate 111 excluding the pad units PA1 and PA2. However, the present disclosure is not limited thereto.

That is, in the pad units PA1 and PA2 at the outer edge of the lighting unit EA, the organic layer 116, the second electrode 117, the adhesive layer 121, and the metal film 122 are not formed so that the first and second contact electrodes 115p and 117p are exposed to the outside.

The pad units PA1 and PA2 may be located outside the lighting unit EA. In FIG. 3A, although it is illustrated that the second pad unit PA2 is located between the first pad units PA1, the present disclosure is not limited thereto.

Further, in FIG. 3A, although it is illustrated that the pad units PA1 and PA2 are located only at one outside of the lighting unit EA, the present disclosure is not limited thereto. Therefore, the pad units PA1 and PA2 of the present disclosure may be disposed in one outside and the other outside of the lighting unit EA. Further, the first pad unit PA1 of the present disclosure may be located at one outside of the lighting unit EA and the second pad unit PA2 may be located at the other outside of the lighting unit EA.

With regard to this, the first contact electrode 115p disposed in the first pad unit PA1 is formed of the same material on the same layer as the first electrode 115 disposed in the lighting unit EA. Therefore, the first contact electrode 115p is formed by the same process when the first electrode 115 is formed, to be electrically connected to the first electrode 115.

The second contact electrode 117p disposed in the second pad unit PA2 is formed of the same material on the same layer as the first electrode 115 disposed in the lighting unit EA by the same process. However, the second contact electrode 117p is separated from the first electrode 115 and the auxiliary line AL which is electrically connected to the first electrode 115 and is electrically connected to the second electrode 117 through a connecting hole CNT.

Specifically, as illustrated in FIG. 4, the first contact electrode 115p is connected to the first electrode 115 through the auxiliary line AL to form an equipotential surface with the first electrode 115. Therefore, the first contact electrode 115p, the auxiliary line AL, and the first electrode 115 are electrically connected to each other. Further, the second contact electrode 117p is electrically connected to the second electrode 117 and a dummy electrode DM.

The above-mentioned dummy electrode DM is formed of the same material on the same layer as the auxiliary line AL, but is electrically isolated from the auxiliary line AL. Therefore, the first electrode 115 and the second electrode 117 are not electrically connected.

With this connection structure, the first contact electrode 115p disposed in the first pad unit PA1 may transmit a signal applied from the outside to the first electrode 115. Further, the second contact electrode 117p disposed in the second pad unit PA2 may transmit the signal applied from the outside to the second electrode 117.

In the meantime, the first electrode 115 is formed of a transparent conductive layer to have an advantage in that the emitted light transmits the first electrode, but also have a disadvantage in that an electric resistance is very high as compared with an opaque metal. Therefore, when a large size lighting apparatus 100 is manufactured, the distribution of the current applied to a large lighting unit EA is not uniform due to a high resistance of the transparent high resistive conductive layer. Therefore, the large size lighting apparatus cannot emit light with uniform luminance due to the current distribution which is not uniform.

Therefore, as illustrated in FIGS. 3B and 4, for the purpose of emission with uniform luminance of the large size lighting apparatus 100, an auxiliary line AL which is electrically connected to the first electrode 115 which makes the distribution of current applied to the lighting unit EA uniform may be disposed.

The auxiliary line AL is disposed over the entire lighting unit EA with a net shape having a small thickness, a mesh shape, a hexagonal or octagonal shape, or a circular shape. The auxiliary line AL may be configured by a metal having a good conductivity such as aluminum (Al), gold (Au), copper (Cu), titanium (Ti), tungsten (W), molybdenum (Mo), or an alloy thereof. Even though not illustrated in the drawing, the auxiliary line AL may be configured to have a double layered structure of an upper auxiliary line AL and a lower auxiliary line AL, but the present disclosure is not limited thereto and the auxiliary line may be configured by a single stack.

Here, in FIG. 4, it is illustrated that the auxiliary line AL which is electrically connected to the first electrode 115 is disposed below the first electrode 115 to be in electrical contact with the first electrode 115. However, the present disclosure is not limited thereto and the auxiliary line AL may be disposed above the first electrode 115.

Further, as illustrated in FIGS. 3B and 4, a short reduction pattern SR is formed in the first electrode 115 to which the current is supplied to implement a narrow path and the plurality of organic layers 116 covers the short reduction pattern SR to suppress the short of the entire panel. That is, the short reduction pattern SR is formed to surround an outer edge of the emission area of the individual pixel and adds a resistor to the individual pixels to restrict current flowing in an area where the short is generated.

An insulating layer INS is disposed between the first electrode 115 and the second electrode 117 on a first area A1 where the auxiliary line AL of the lighting unit EA is disposed to suppress the short between the first electrode 115 and the second electrode 117 due to the damage of the organic layer 116.

Specifically, the insulating layer INS is configured to cover the auxiliary line AL and the first electrode 115. As described above, the insulating layer INS is formed so as to enclose the auxiliary line AL to reduce the step due to the auxiliary line AL. Therefore, various layers which are formed on the insulating layer INS thereafter may be stably formed without being shorted.

Here, the insulating layer INS may be configured by an inorganic material such as silicon oxide SiOx or silicon nitride SiNx. However, the insulating layer INS may be configured by an organic layer such as photoacryl PAC and also configured by a plurality of layers of inorganic layers and organic layers.

Hereinafter, a barrier layer of a lighting apparatus including an organic light emitting diode according to an exemplary disclosure of the present disclosure will be described in detail with reference to FIG. 4.

As illustrated in FIG. 4, the lighting apparatus 100 including an organic light emitting diode according to an exemplary disclosure of the present disclosure may be divided into a first area A1 in which the auxiliary line AL is disposed and a second area A2 in which the organic barrier pattern 114b is disposed. A part of the second area A2 may include an emission area in which the first electrode 115, the organic layer 116, and the second electrode 117 are sequentially laminated to emit light.

Here, as illustrated in FIG. 3B, a plurality of emission areas defined by the organic layer 116 and the first electrode 115 which is in contact with the second electrode 117 is formed to configure individual pixels. A non-emission area is formed to surround the emission area in a matrix shape.

The barrier layer 114 includes a first inorganic barrier layer 114a disposed in both the first area A1 and the second area A2, a second organic barrier pattern 114b disposed in the second area A2 on the first inorganic barrier layer 114a, and a second inorganic barrier layer 114c which is disposed in both the first area A1 and the second area A2 to surround and cover the organic barrier pattern 114b.

More specifically, the organic barrier pattern 114b is disposed in the entire second area A2 so that an end of the organic barrier refers to an end of the second area A2. Further, the auxiliary line AL is disposed in the entire first area A1 so that an end of the auxiliary line AL refers to an end of the first area A1. Further, the first area A1 and the second area A2 are continuous so that the end of the organic barrier pattern 114b and the end of the auxiliary line AL are disposed on the same line.

Further, the organic barrier pattern 114b is disposed only in the second area A2 of the lighting unit EA to have an island shape, but is not disposed in the pad units PA1 and PA2.

The first inorganic barrier layer 114a and the second inorganic barrier layer 114c perform a moisture proofing function and the organic barrier pattern 114b serves to block the fine particles. Therefore, the first inorganic barrier layer 114a and the second inorganic barrier layer 114c may be configured by one of Al2O3, ZrO2, HfO2, TiO2, ZnO, Y2O3, CeO2, Ta2O5, La2O5, Nb2O5, SiO2, and SiNx which are inorganic insulating materials. Further, the organic barrier pattern 114b may be configured by acrylic resin or epoxy resin, and specifically may be configured by a photoacryl (PAC).

Generally, when the first and second inorganic barrier layers 114a and 114c are thin films formed by a chemical vapor deposition method, a thickness is approximately 1000 to 4000 Å. Further, when the first and second inorganic barrier layers are films formed by an atomic layer deposition process, a thickness is approximately 300 to 500 Å. In the case of the organic barrier pattern 114b, a slit coater process is used to apply a thickness of 1 to 5 ☐m. However, the thickness may be reduced or increased to a predetermined level depending on the process or the environment. That is, the thickness of the organic barrier pattern 114b may be thicker than each of the thicknesses of the first inorganic barrier layer 114a and the second inorganic barrier layer 114c.

Here, since the organic barrier pattern 114b is formed by the slit coater process, an upper surface of the organic barrier pattern 114b may be formed to be flat. Therefore, a separate component for planarization on the organic barrier pattern 114b is not necessary.

Unlike the exemplary disclosure of the present disclosure, when all the first inorganic barrier layer 114a, the organic barrier layer, and the second inorganic barrier layer 114c are disposed in the entire first area A1 and second area A2, the moisture permeation is suppressed in a vertical direction of the lighting apparatus. Further, the reliability for the defect of the barrier layer due to the fine particles is improved.

However, due to a weak moisture proofing function in a horizontal direction of the organic barrier layer, moisture permeating through the first inorganic barrier layer 114a permeates onto the organic barrier layer. Further, the permeating moisture moves in the horizontal direction of the organic barrier layer to be transmitted through the second inorganic barrier layer 114c, which may cause a damage on the organic layer 116.

That is, when the organic barrier layer is formed on the entire first area A1 and second area A2, there may be a problem in that the organic barrier layer provides a horizontal movement path of the permeated moisture.

Therefore, the lighting apparatus including an organic light emitting diode according to the exemplary disclosure of the present disclosure includes the first inorganic barrier layer 114a disposed in both the first area A1 and the second area A2, the organic barrier pattern 114b disposed in the second area A2 on the first inorganic barrier layer 114a, and the second inorganic barrier layer 114c which is disposed in both the first area A1 and the second area A2 to surround and cover the organic barrier pattern 114b. Therefore, the organic barrier layer is not formed in the entire first area A1 and second area A2, but the organic barrier pattern 114b is formed only in the second area A2.

First, the damage due to the moisture permeation in the vertical direction of the lighting apparatus and the fine particles will be separately analyzed for the first area A1 and the second area A2 as follows.

In the first area A1, after disposing the first inorganic barrier layer 114a, the second inorganic barrier layer 114c, the auxiliary line AL, the first electrode 115, and the insulating layer INS in a vertical direction, the organic layer 116 is disposed. Even though the moisture is permeated from the lower portion of the first area A1, the permeated moisture is blocked by the first inorganic barrier layer 114a and the second inorganic barrier layer 114c. Moreover, the moisture and the fine particles at the lower portion are completely blocked by the auxiliary line AL disposed in the first area A1 so that the moisture is not permeated into the first area A1. Further, there is no concern of the damage of components due to the fine particles.

Further, in the second area A2, after disposing the first inorganic barrier layer 114a, the organic barrier pattern 114b, the second inorganic barrier layer 114c, and the first electrode 115 in the vertical direction, the organic layer 116 is disposed. Therefore, as described above, even though the moisture is permeated from the lower portion, the moisture permeation is blocked by the first inorganic barrier layer 114a and the second inorganic barrier layer 114c and the risk of the damage due to the fine particles is reduced by the organic barrier pattern 114b.

Next, the moisture permeation in the horizontal direction will be analyzed as follows.

With respect to the horizontal direction of the lighting apparatus, some of moisture which passes through the first inorganic barrier layer 114a permeates onto the organic barrier pattern 114b and the permeating moisture moves in the horizontal direction of the organic barrier pattern 114b. However, the organic barrier pattern 114b is formed only in the second area A2, but is not formed in the first area A1 so that the permeating moisture is restricted to move in the horizontal direction.

Therefore, the moisture permeating the organic barrier pattern 114b does not move in the horizontal direction so that the moisture moves only in the vertical direction. However, as described above, the moisture cannot permeate in the vertical direction so that the moisture does not permeate the organic layer 116.

That is, the organic barrier pattern 114b is formed only in the second area A2 to block the horizontal movement path of the moisture.

Consequently, the lighting apparatus 100 including an organic light emitting diode according to the exemplary disclosure of the present disclosure includes the organic barrier pattern 114b having an island shape in the second area A2. Therefore, the moisture permeation from the outside is effectively blocked to improve the reliability of the lighting apparatus.

FIGS. 5A to 5J are plan views sequentially illustrating a manufacturing method of a lighting apparatus using an organic light emitting diode according to an exemplary disclosure of the present disclosure illustrated in FIG. 4.

Hereinafter, a lighting apparatus using an organic light emitting diode according to an exemplary disclosure of the present disclosure illustrated in FIGS. 1 to 4 will be referred to.

Referring to FIG. 5A, a first inorganic barrier layer 114a is deposited on the entire surface of the substrate 111 which is divided into the lighting unit EA and the pad units PA1 and PA2. Here, the first inorganic barrier layer 114a may be formed by an atomic layer deposition method, but it is not limited thereto and various deposition methods such as a physics vapor deposition method and a chemical vapor deposition method may be used.

Here, the first inorganic barrier layer 114a may be configured by one of Al2O3, ZrO2, HfO2, TiO2, ZnO, Y2O3, CeO2, Ta2O5, La2O5, Nb2O5, SiO2, and SiNx which are inorganic insulating materials.

When the first inorganic barrier layer 114a is a thin film formed by a chemical vapor deposition method, the first inorganic barrier layer 114a may be deposited to have a thickness of approximately 1000 to 4000 Å. Further, when the first inorganic barrier layer is a film formed by an atomic layer deposition process, the first inorganic barrier layer may be deposited to have a thickness of approximately 300 to 500 Å. However, the thickness may be reduced or increased to a predetermined level depending on the process or the environment.

The substrate 111 may be configured by a transparent glass. Further, the substrate 111 may be configured by a polymer material having flexibility such as polyimide.

Figure 5B:
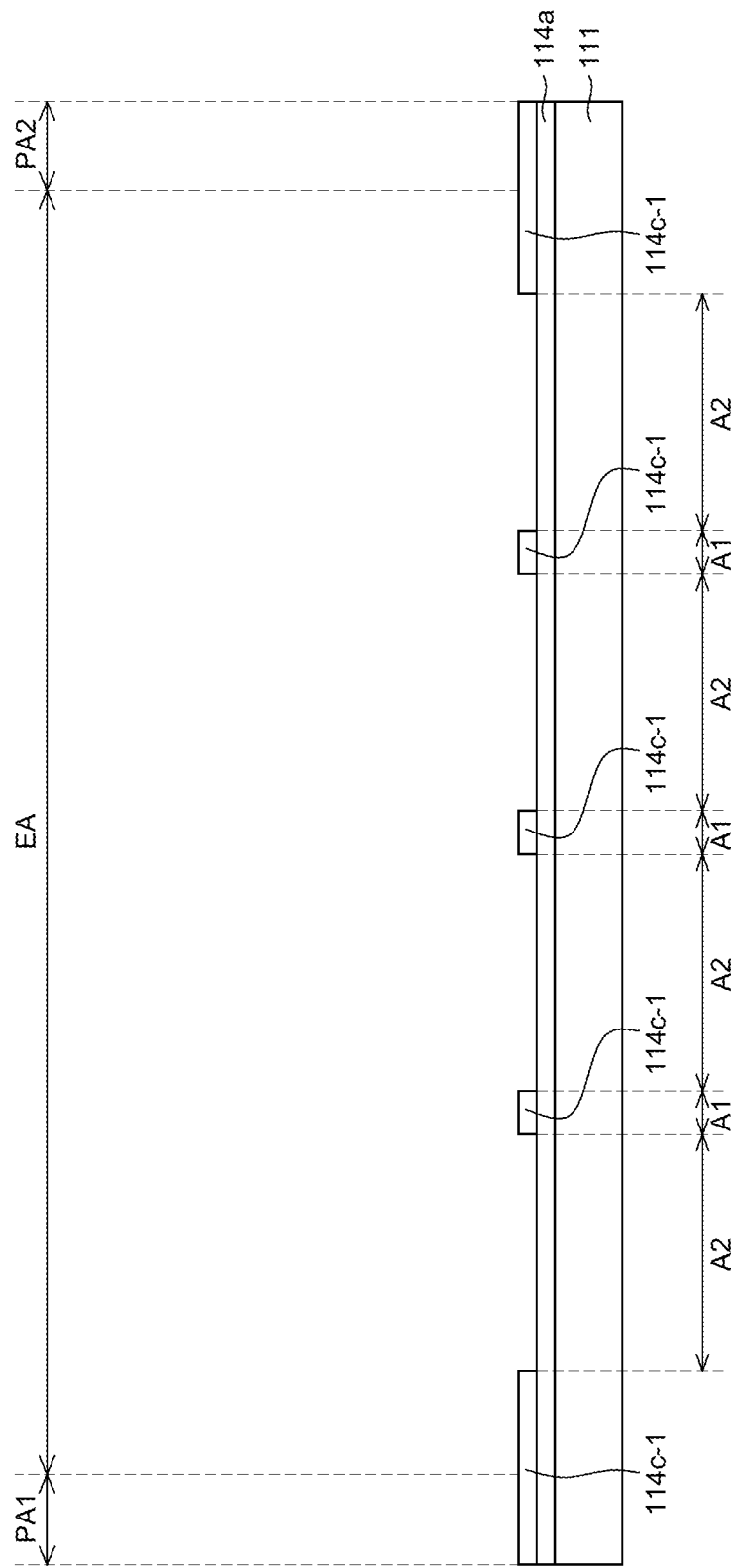

Next, referring to FIG. 5B, the second inorganic barrier pattern 114c-1 is formed in the first area A1 on the substrate 111 on which the first inorganic barrier layer 114a is deposited.

Even though not illustrated in the drawing, a mask is disposed on the second area A2 and the second inorganic barrier pattern 114c-1 may be formed only in the first area A1 in which no mask is disposed.

The second inorganic barrier pattern 114c-1 is formed not only in the first area A1 of the lighting unit EA, but also in the pad units PA1 and PA2 so that the organic barrier pattern 114b which is formed by a post process is not formed in the pad units PA1 and PA2.

Figure 5C:
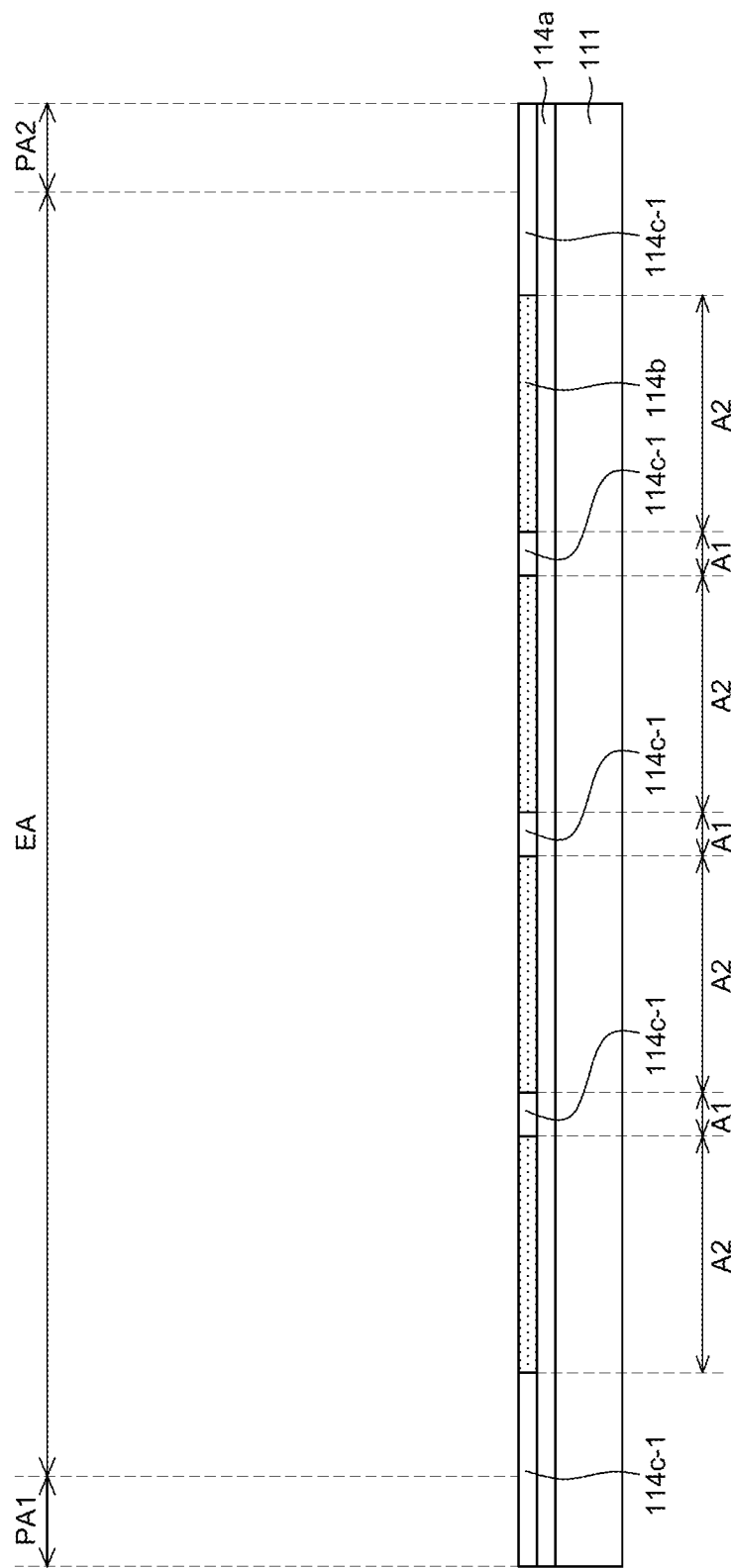

Next, referring to FIG. 5C, the organic barrier pattern 114b is formed in the second area A2 on the substrate on which the first inorganic barrier layer 114a is deposited.

Here, the organic barrier layer 114b may be formed of acrylic resin or epoxy resin, and specifically, may be formed of photoacryl (PAC).

Specifically, the organic barrier pattern 114b is formed in the second area A2 between the second inorganic barrier patterns 114c-1 using a slit coater process to have a thickness of 1 to 5 μm.

Here, since the organic barrier pattern 114b is formed by the slit coater process, an upper surface of the organic barrier pattern 114b may be formed to be flat. Therefore, a separate component for planarization on the organic barrier pattern 114b is not necessary.

Figure 5D:
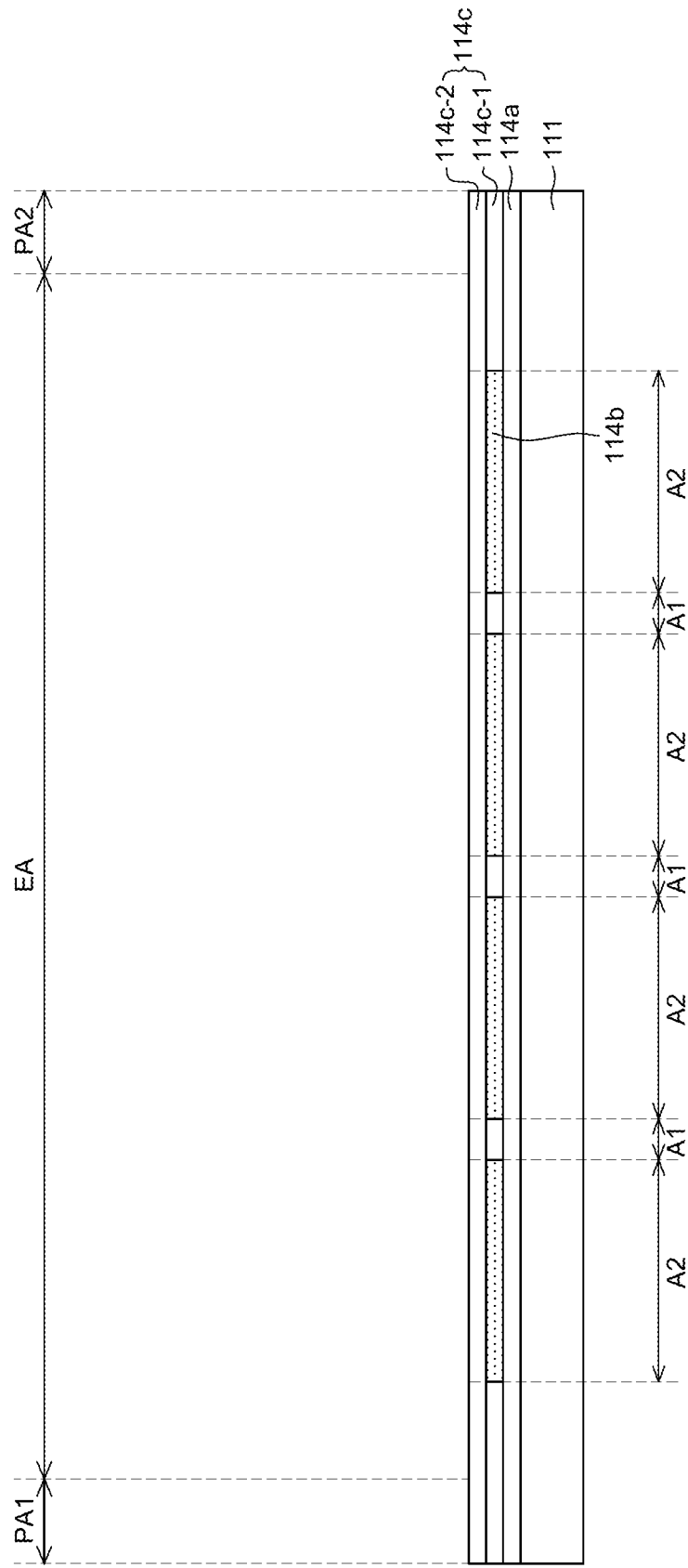

Next, referring to FIG. 5D, a second inorganic barrier upper layer 114c-2 is deposited on the entire surface of the substrate 111 on which the organic barrier pattern 114b and the second inorganic barrier pattern 114c-1 are formed. Here, the second inorganic barrier upper layer 114c-2 may be formed by the atomic layer deposition method like the deposition of the first inorganic barrier layer 114a, but it is not limited thereto and various deposition methods such as a physics vapor deposition method and a chemical vapor deposition method may be used.

Here, the second inorganic barrier upper layer 114c-2 may also be configured by one of Al2O3, ZrO2, HfO2, TiO2, ZnO, Y2O3, CeO2, Ta2O5, La2O5, Nb2O5, SiO2, and SiNx.

When the second inorganic barrier upper layer 114c-2 is a thin film formed by a chemical vapor deposition method, the second inorganic barrier upper layer 114c-2 may be deposited to have a thickness of approximately 1000 to 4000 Å. Further, when the second inorganic barrier upper layer 114c-2 is a film formed by an atomic layer deposition process, the second inorganic barrier upper layer 114c-2 may be deposited to have a thickness of approximately 300 to 500 Å. However, the thickness may be reduced or increased to a predetermined level depending on the process or the environment.

Hereinafter, the second inorganic barrier upper layer 114c-2 and the second inorganic barrier pattern 114c-1 are integrally defined as the second inorganic barrier layer 114c.

Figure 5E:
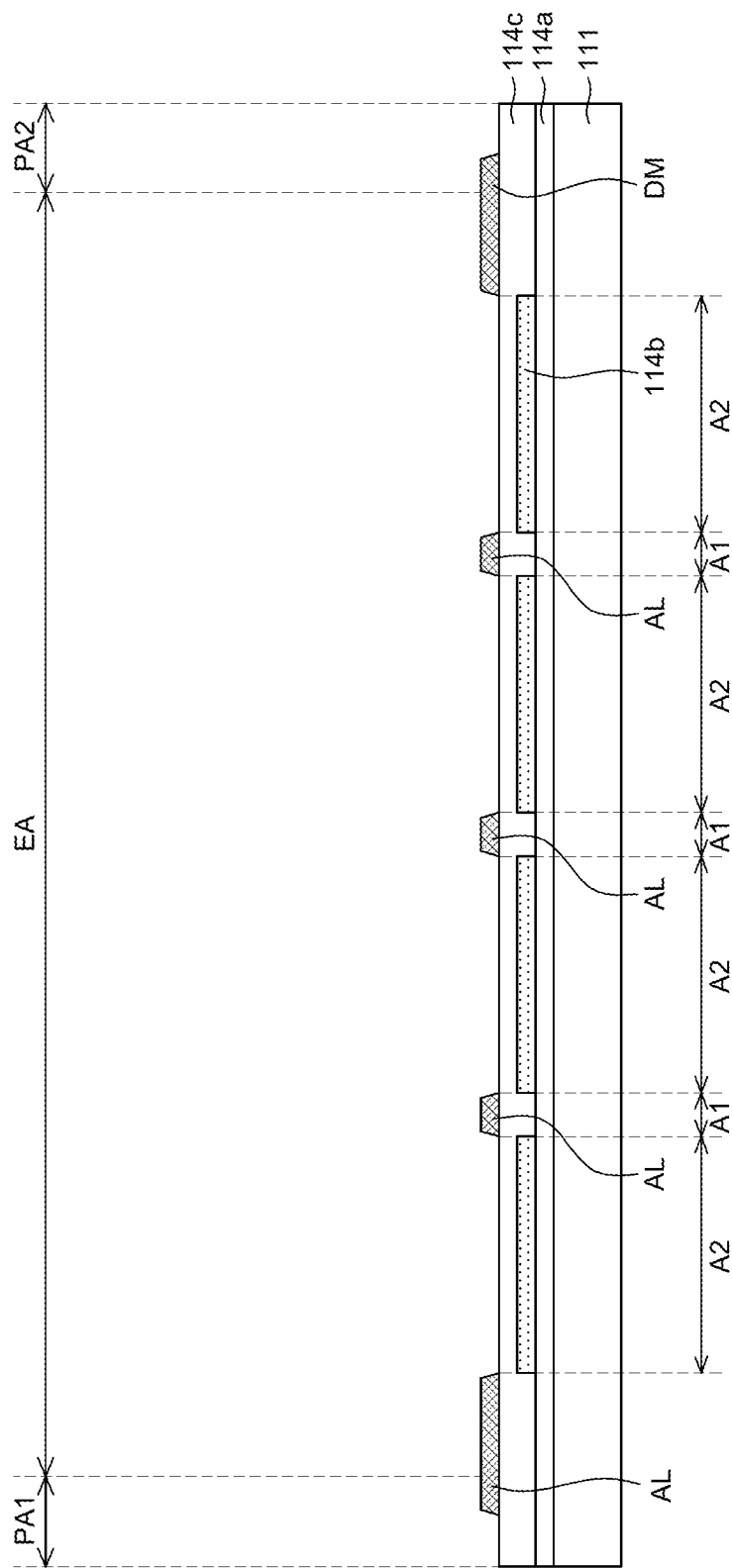

Next, referring to FIG. 5E, the auxiliary line AL and the dummy electrode DM are formed in the first area A1 on the substrate 111 on which the second inorganic barrier layer 114c is deposited.

Here, the auxiliary line AL and the dummy electrode DM may be formed of the same material on the same layer by the same process. Specifically, the dummy electrode DM may be partially formed in the second pad unit PA2 to be connected to the second contact electrode 117p which will be described below.

Even though not specifically illustrated, a single stack or multi-stack conductive layer of a metal having a good conductivity such as aluminum (Al), gold (Au), copper (Cu), titanium (Ti), tungsten (W), molybdenum (Mo), or an alloy thereof is formed on the entire surface of the substrate on which the second inorganic barrier layer 114c is formed. Thereafter, after forming a photo mask only in the second area A2, the laminated conductive layer is etched to form the auxiliary line AL and the dummy electrode DM to be disposed in the first area A1.

Figure 5F:
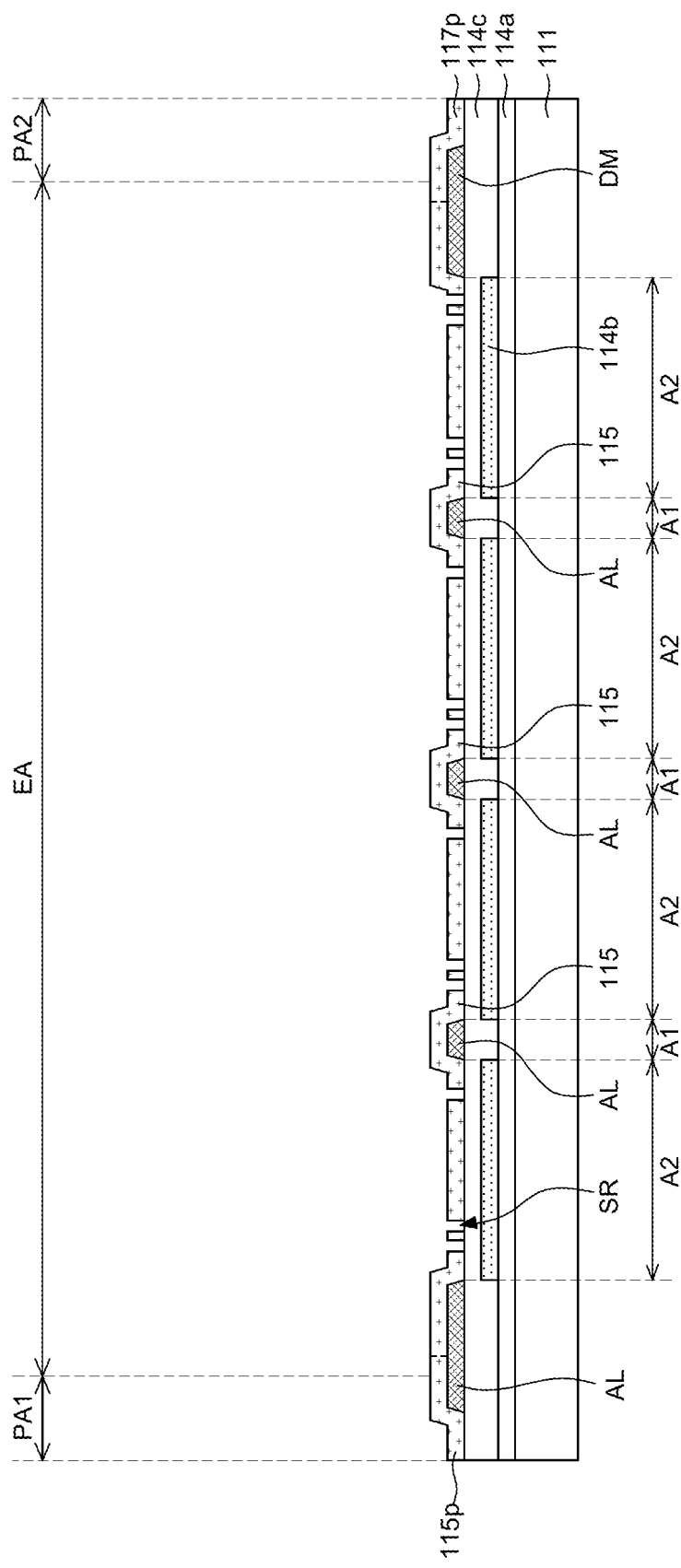

Next, referring to FIG. 5F, an oxide material such as indium tin oxide (ITO) or indium zinc oxide (IZO) or a thin metal film is deposited to be patterned to form the first electrode 115, the first contact electrode 115p, and the second contact electrode 117p. Here, a specific example of the thin metal film may refer to a metal such as magnesium (Mg), calcium (Ca), sodium (Na), titanium (Ti), indium (In), yttrium (Y), lithium (Li), gadolinium (Gd), aluminum (Al), silver (Ag), tin (Sn) and lead (Pb), or an alloy thereof. The first electrode 115 may also be configured by the single stack or configured by the multi-stack configured by the above-mentioned materials.

Specifically, as described above, in the first electrode 115 formed in the lighting unit EA, a short reduction pattern SR which implements a narrow path at the outer edge of the second area A2 may be formed.

Further, the first contact electrode 115p is formed in the first pad unit PA1 to be electrically connected to the first electrode 115 and the auxiliary line AL. The second contact electrode 117p is formed in the second pad unit PA2 to be electrically shorted from the first electrode 115 and the auxiliary line AL and be electrically connected to the dummy electrode DM.

Figure 5G:
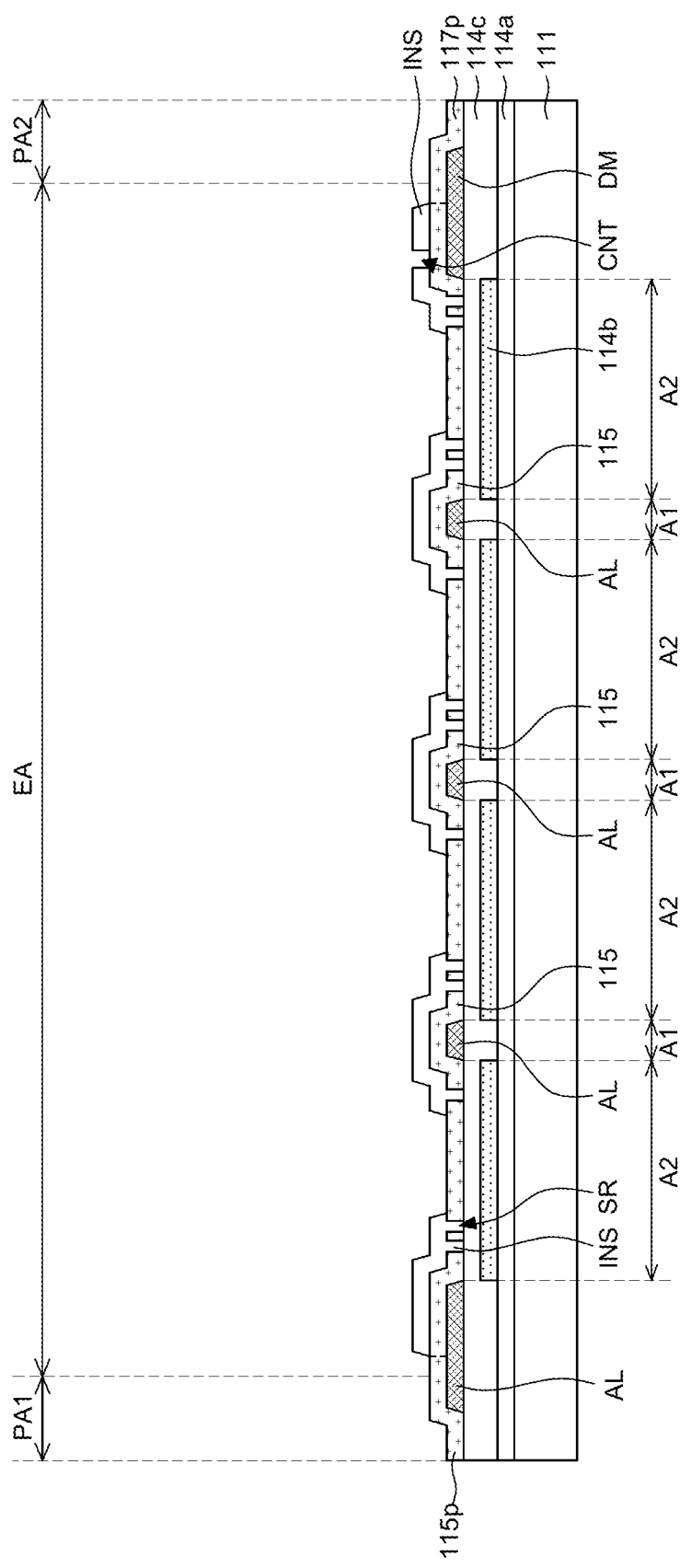

Next, referring to FIG. 5G, the insulating layer INS is formed on the first electrode 115 on which the short reduction pattern SR is formed.

Further, the insulating layer INS is formed in the entire first area A1 to be divided into a plurality of insulating layers to cover the short reduction pattern SR formed in the second area A2.

Further, for the purpose of the contact of the second electrode 117 and the second contact electrode 117p formed by the post process, the insulating layer INS disposed in the lighting unit EA adjacent to the second pad unit PA2 may be formed to include a contact hole CNT.

Here, the insulating layer INS may be formed by an inorganic material such as silicon oxide SiOx or silicon nitride SiNx. However, the insulating layer INS may be formed by an organic layer such as photoacryl (PAC) and also formed by a plurality of layers of inorganic layers and organic layers.

Figure 5H:
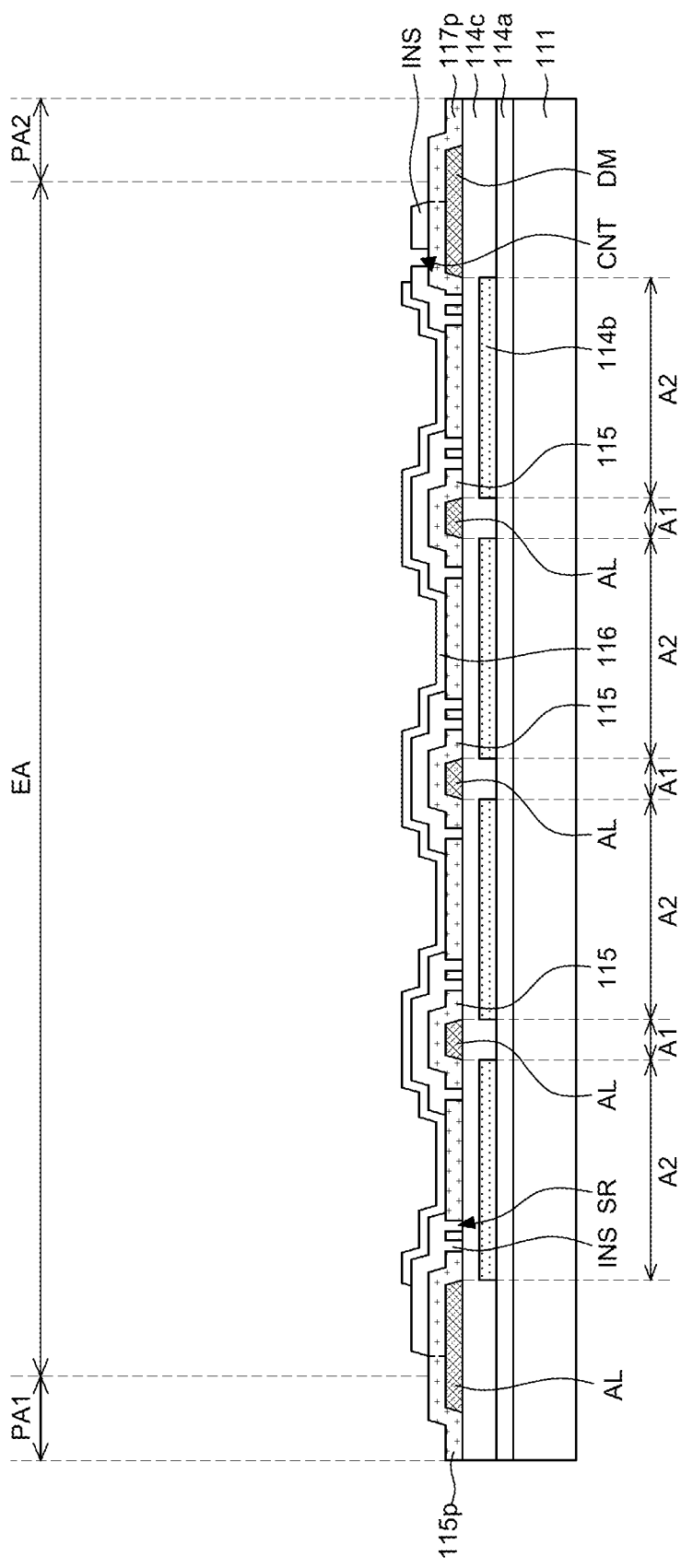

Next, referring to FIG. 5H, the organic layer 116 is formed on the entire surface of the substrate 111 on which the insulating layer INS and the first electrode 115 are formed.

The organic layer 116 may be configured by a single stack structure including a red organic light emitting layer or formed to have a multi-stack tandem structure including a plurality of red organic light emitting layers, or a multi-stack tandem structure including a red-green organic light emitting layer and a sky blue organic light emitting layer.

Specifically, the organic layer 116 which is disposed in the second area A2 and abuts against the first electrode 115 is applied with current to emit light. In contrast, an organic layer 116 which is disposed in the first area A1 and abuts against the insulating layer INS is not applied with the current so that the light is not emitted.

Figure 5I:
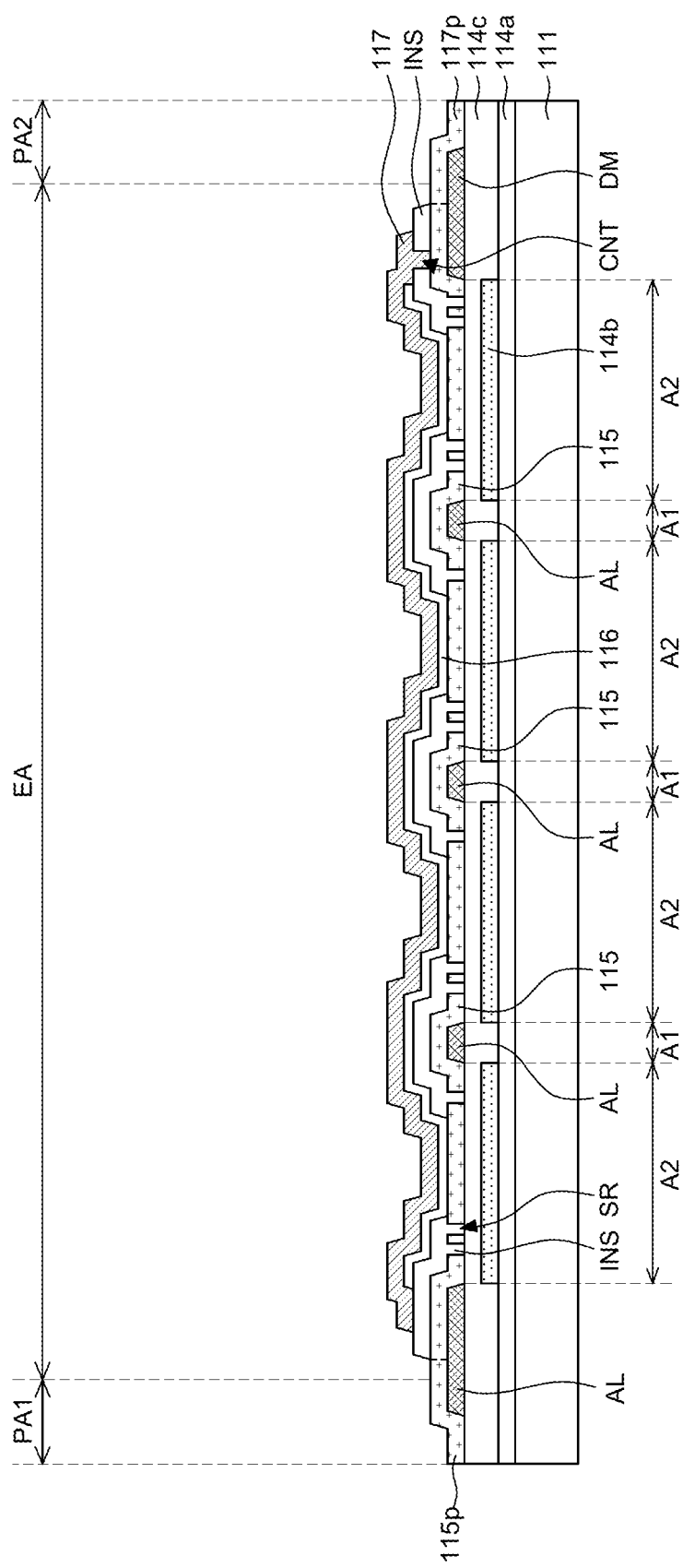

Next, referring to FIG. 5I, the second electrode 117 is deposited so as to cover the plurality of organic layers 116.

Here, the second electrode 117 may be formed of a metal such as magnesium (Mg), calcium (Ca), sodium (Na), titanium (Ti), indium (In), yttrium (Y), lithium (Li), gadolinium (Gd), aluminum (Al), silver (Ag), tin (Sn) and lead (Pb), or an alloy thereof. Further, the second electrode 117 may be formed as a single stack or also formed as a multi-stack configured by the above-mentioned material. One side of the second electrode 117 is formed to be electrically connected to the second contact electrode 117p.

Figure 5J:
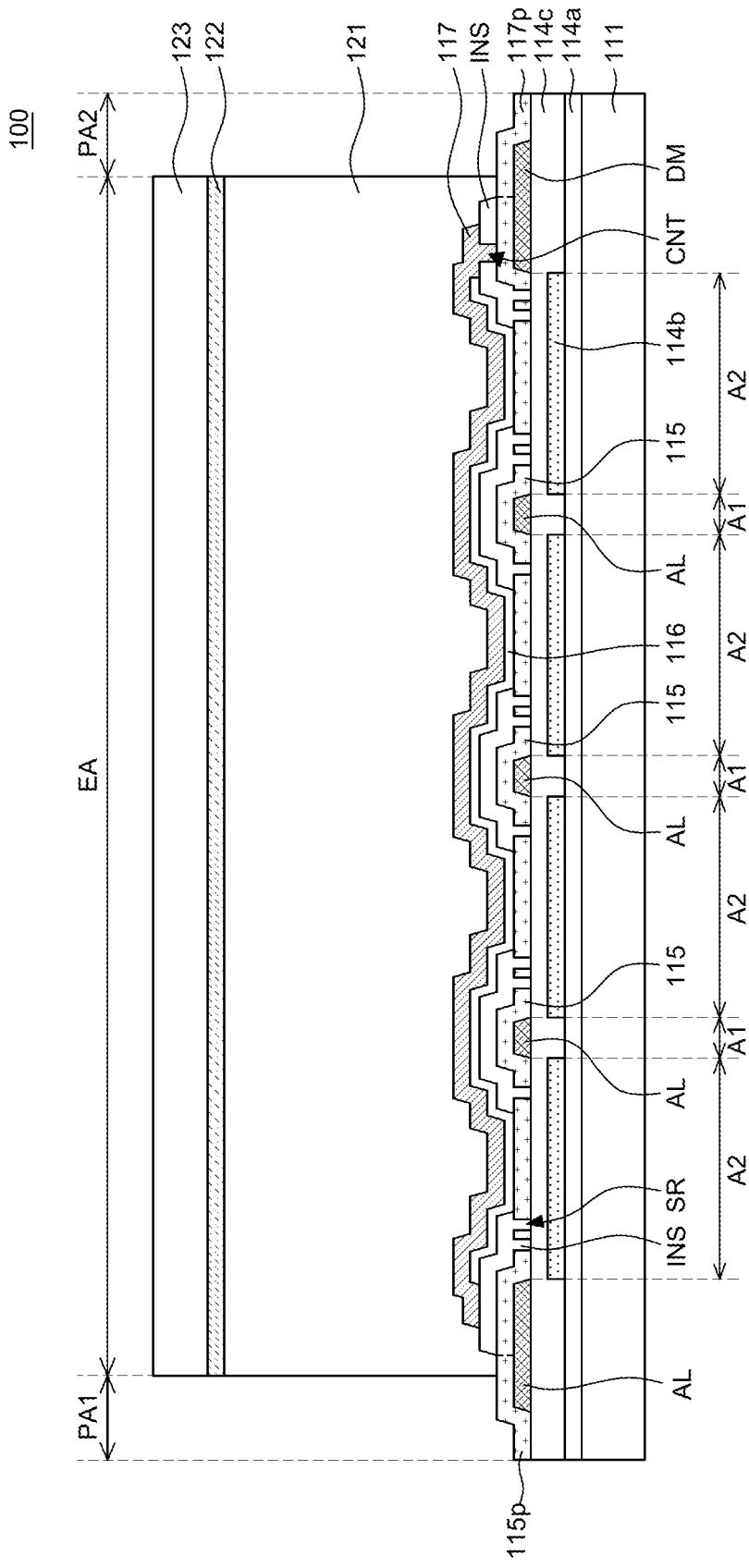

Next, referring to FIG. 5J, on the entire surface of the lighting unit of the substrate 111 excluding the first and second pad units PA1 and PA2, a pressure sensitive adhesive (PSA) layer 121, the metal film 122, and a protective film 123 are formed. Further, a pressure is applied to the metal film 122 and the protective film 123 from the upper portion to the lower portion to bond the metal film 122 and the protective film 123 to each other, thereby completing the lighting apparatus.

Hereinafter, a lighting apparatus using an organic light emitting diode according to another exemplary disclosure of the present disclosure will be described. A difference between the exemplary disclosure of the present disclosure and another exemplary disclosure of the present disclosure is a structure of the barrier layer. Therefore, the same part of another exemplary disclosure of the present disclosure as one exemplary disclosure of the present disclosure will be omitted and a structure of the barrier layer will be mainly described.

Figure 6:
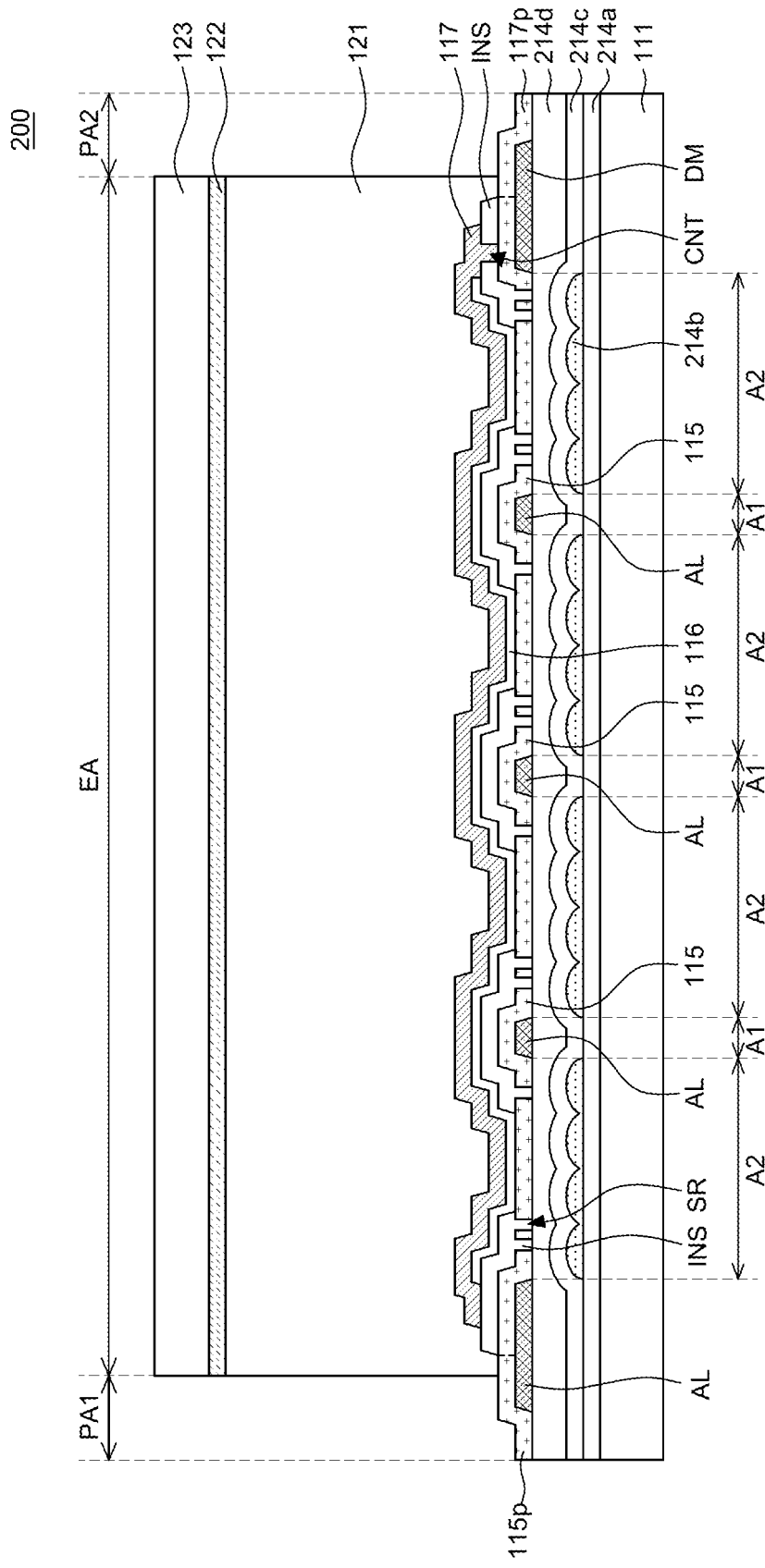
FIG. 6 is a cross-sectional view of a lighting apparatus using an organic light emitting diode according to another exemplary disclosure of the present disclosure.

FIG. 6 is a cross-sectional view of a lighting apparatus using an organic light emitting diode according to another exemplary disclosure of the present disclosure.

A barrier layer of a lighting apparatus using an organic light emitting diode according to another exemplary disclosure of the present disclosure includes a first inorganic barrier layer 214a, a round organic barrier pattern 214b disposed in the second area A2, a second inorganic barrier layer 214c, and a barrier planarizing layer 214d.

Specifically, as illustrated in FIG. 6, the barrier layer of a lighting apparatus using an organic light emitting diode according to another exemplary disclosure of the present disclosure includes the first inorganic barrier layer 214a which is disposed in both the first area A1 and the second area A2 on the substrate 111, at least one round organic barrier pattern 214b disposed in the second area A2 on the first inorganic barrier layer 214a, the second inorganic barrier layer 214c which is disposed in both the first area A1 and the second area A2 so as to cover and surround the organic barrier pattern 214b, and the barrier planarizing layer 214d which compensates the roughness due to at least one round organic barrier pattern 214b.

More specifically, the organic barrier pattern 214b is disposed in the entire second area A2 so that an end of the organic barrier pattern 214b refers to an end of the second area A2. Further, the auxiliary line AL is disposed in the entire first area A1 so that an end of the auxiliary line AL refers to an end of the first area A1. Further, the first area A1 and the second area A2 are continuous so that the end of the organic barrier pattern 214b and the end of the auxiliary line AL are disposed on the same line.

Further, at least one round organic barrier pattern 214b is disposed only in the second area A2 of the lighting unit EA to have an island shape, but is not disposed in the pad units PA1 and PA2.

Here, the first inorganic barrier layer 214a and the second inorganic barrier layer 214c perform a moisture proofing function and the organic barrier pattern 214b serves to block the fine particles. Therefore, the first inorganic barrier layer 214a and the second inorganic barrier layer 214c may be configured by one of $Al_2O_3$, $ZrO_2$, $HfO_2$, $TiO_2$, ZnO, $Y_2O_3$, $CeO_2$, $Ta_2O_5$, $La_2O_5$, $Nb_2O_5$, $SiO_2$, and SiNx which are inorganic insulating materials. Further, the organic barrier pattern 214b may be configured by acrylic resin or epoxy resin, and specifically may be configured by a photoacryl (PAC).

Generally, for the first and second inorganic barrier layers 214a and 214c, when a thin film formed by a chemical vapor deposition method is used, a thickness is approximately 1000 to 4000 Å. Further, when a film formed by an atomic layer deposition process is used, a thickness is approximately 300 to 500 Å. In the case of the organic barrier pattern 214b, an inkjet process is used to apply a thickness of 1 to 5 µm. However, the thickness may be reduced or increased to a predetermined level depending on the process or the environment. That is, the thickness of the organic barrier pattern 214b may be thicker than each of the thicknesses of the first inorganic barrier layer 214a and the second inorganic barrier layer 214c.

Here, since the organic barrier pattern 214b is formed by the inkjet process, the organic barrier pattern 214b may be formed to have at least one round shape.

Therefore, the second inorganic barrier layer 214c which covers the round organic barrier pattern 214b may also have a round shape. Therefore, when the first electrode 115 is directly formed on the round barrier layer, a defect may be caused between the barrier layer and the organic light emitting diode so that the reliability of the lighting apparatus may be undesirably degraded.

In order to solve the problem of the degradation of the surface uniformity, the lighting apparatus 200 according to another exemplary disclosure of the present disclosure further includes a barrier planarizing layer 214d on the second inorganic barrier layer 214c.

The barrier planarizing layer 214d needs to be configured by a material which can be subjected to a soluble process to planarize the barrier layer. As described above, when the barrier planarizing layer 214d is formed by an organic layer, a movement path of the permeated moisture is provided. Therefore, the planarizing layer needs to be formed of an inorganic layer.

Therefore, the barrier planarizing layer 214d may be configured by siloxane or silazane which is an inorganic material on which the soluble process can be performed.

FIGS. 7A to 7J are plan views sequentially illustrating a manufacturing method of a lighting apparatus using an organic light emitting diode according to another exemplary disclosure of the present disclosure illustrated in FIG. 6.

Next, a manufacturing method of a lighting apparatus using an organic light emitting diode according to another exemplary disclosure of the present disclosure will be described with reference to FIGS. 7A to 7J.

As described above, a difference between the exemplary disclosure of the present disclosure and another exemplary disclosure of the present disclosure is a structure of the barrier layer. Therefore, the manufacturing method of a barrier layer according to another exemplary disclosure of the present disclosure will be described in detail.

Figure 7A:
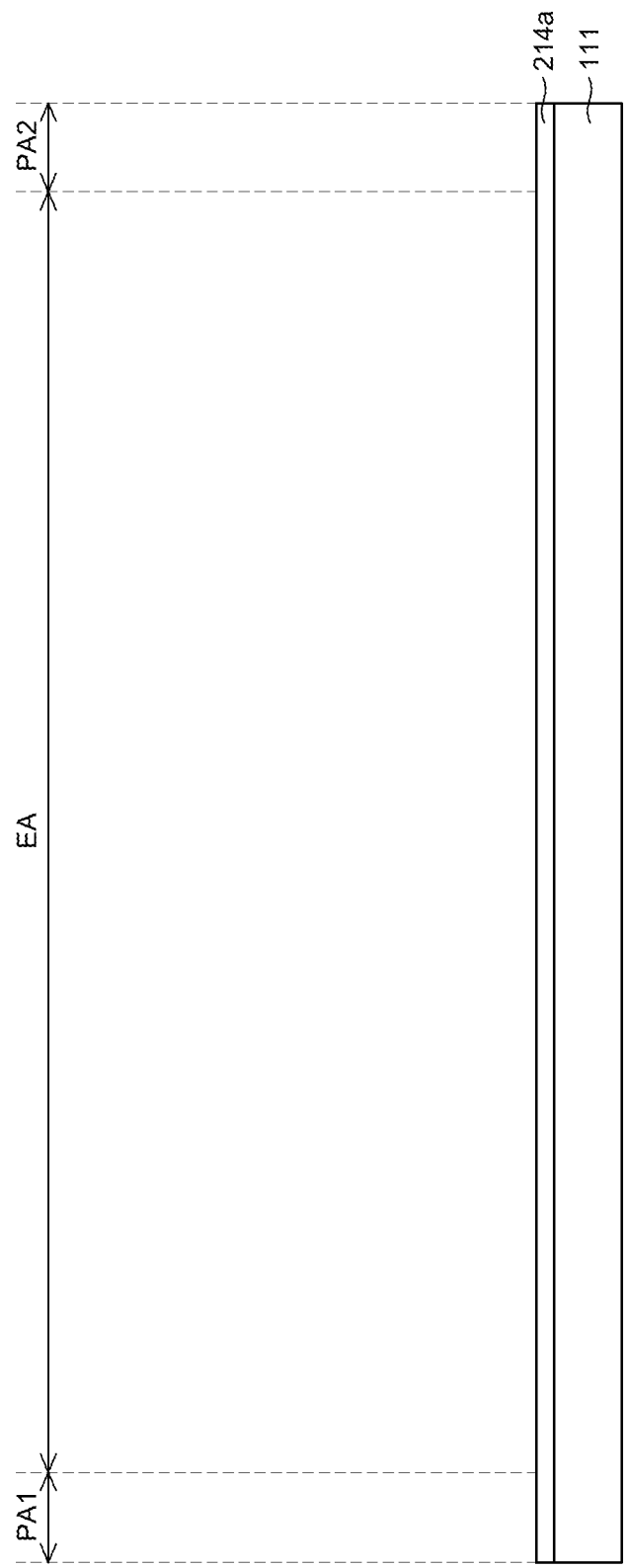

Referring to FIG. 7A, a first inorganic barrier layer 214a is deposited on the entire surface of the substrate 111 which is divided into the lighting unit EA and the pad units PA1 and PA2. Here, the first inorganic barrier layer 214a may be formed by an atomic layer deposition method, but it is not limited thereto and various deposition methods such as a physics vapor deposition method and a chemical vapor deposition method may be used.

Here, the first inorganic barrier layer 214a may be configured by one of Al2O3, ZrO2, HfO2, TiO2, ZnO, Y2O3, CeO2, Ta2O5, La2O5, Nb2O5, SiO2, and SiNx which are inorganic insulating materials.

When the first inorganic barrier layer 214a is a thin film formed by a chemical vapor deposition method, the first inorganic barrier layer 214a may be deposited to have a thickness of approximately 1000 to 4000 Å. Further, when the first inorganic barrier layer is a film formed by an atomic layer deposition process, the first inorganic barrier layer may be deposited to have a thickness of approximately 300 to 500 Å. However, the thickness may be reduced or increased to a predetermined level depending on the process or the environment.

The substrate 111 may be configured by a transparent glass. Further, the substrate 111 may be configured by a polymer material having flexibility such as polyimide.

When the first inorganic barrier layer 214a is a thin film formed by a chemical vapor deposition method, the first inorganic barrier layer 214a may be deposited to have a thickness of approximately 1000 to 4000 Å. Further, when the first inorganic barrier layer is a film formed by an atomic layer deposition process, the first inorganic barrier layer may be deposited to have a thickness of approximately 300 to 500 Å. However, the thickness may be reduced or increased to a predetermined level depending on the process or the environment.

Next, as illustrated in FIG. 7B, at least one round organic barrier pattern 214b is formed in the second area A2 on the substrate 111 on which the first inorganic barrier layer 214a is deposited, by an inkjet process.

Specifically, first, a surface of the first inorganic barrier layer 214a deposited on the substrate 111 is subjected to hydrophobic treatment. By doing this, by increasing a surface energy of the first inorganic barrier layer 214a, when the organic material is applied in the second area A2 later, a spreading degree of the applied organic material may be controlled.

Next, the organic material is superimposed by repeatedly applying the organic material in the second area A2 to form at least one round organic barrier pattern 214b in the second area A2.

Specifically, the organic barrier pattern 214b may be formed of acrylic resin or epoxy resin, and specifically, formed of photoacryl (PAC), using the inkjet process to have a thickness of 1 to 5 µm. However, the thickness may be reduced or increased to a predetermined level depending on the process or the environment.

Next, in FIG. 7B, it is disclosed that a shape of the organic barrier pattern 214b includes a plurality of round shapes, but is not limited thereto. The organic barrier pattern 214b may be formed to have one round shape, that is, a dome shape and the shape may be determined depending on the viscosity of the organic material and a degree of hydrophobic treatment of the surface of the first inorganic barrier layer 214a.

Figure 7C:
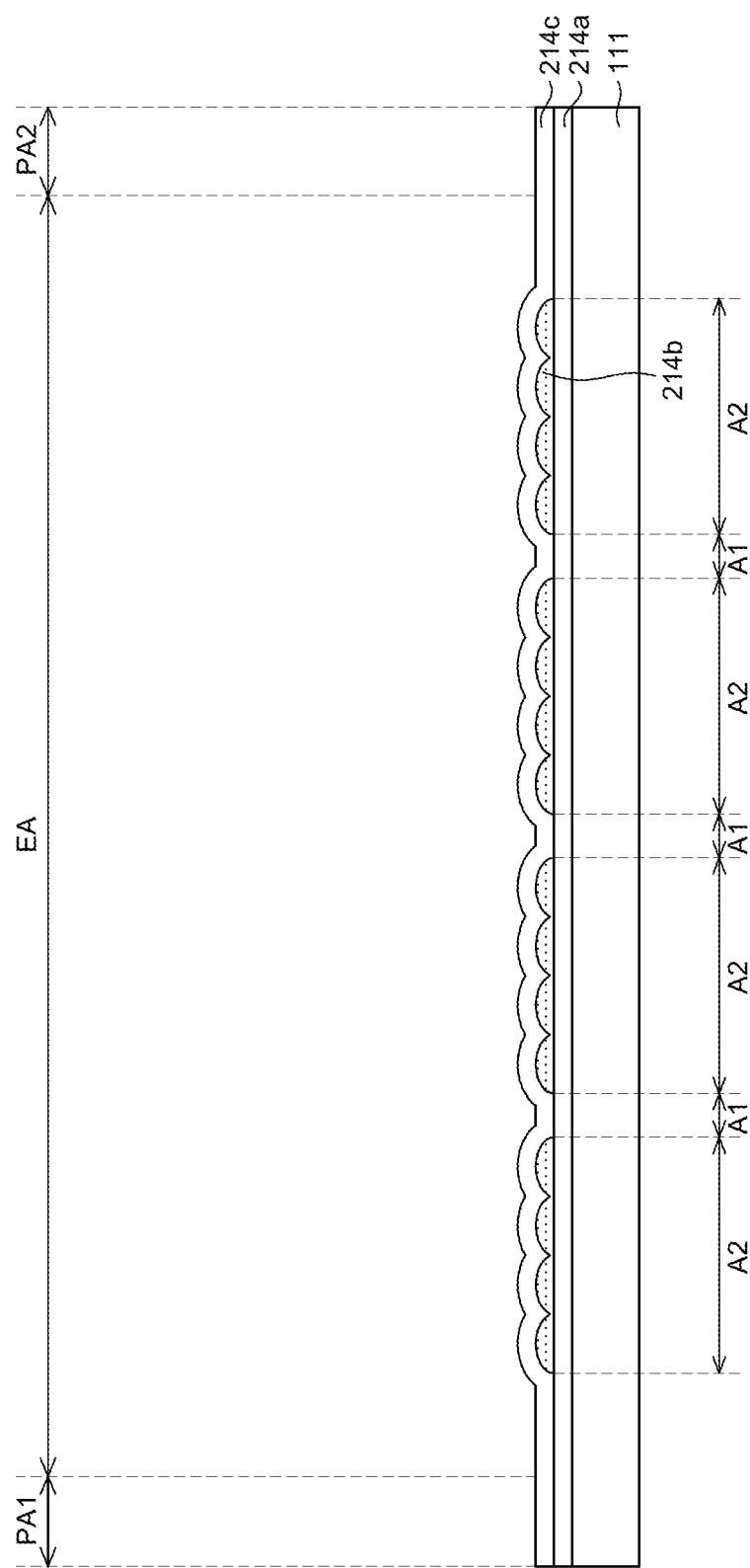

Next, referring to FIG. 7C, the second inorganic barrier layer 214c is deposited on the entire surface of the substrate 111 on which the organic barrier pattern 214b is formed. Here, the second inorganic barrier layer 214c may be formed by the atomic layer deposition method like the deposition of the first inorganic barrier layer 214a, but it is not limited thereto and various deposition methods such as a physics vapor deposition method and a chemical vapor deposition method may be used.

Here, the second inorganic barrier layer 214c may be configured by one of Al2O3, ZrO2, HfO2, TiO2, ZnO, Y2O3, CeO2, Ta2O5, La2O5, Nb2O5, SiO2, and SiNx which are inorganic insulating materials.

When the second inorganic barrier layer 214c is a thin film formed by a chemical vapor deposition method, the second inorganic barrier layer 214c may be deposited to have a thickness of approximately 1000 to 4000 Å. Further, when the second inorganic barrier layer 114c is a film formed by an atomic layer deposition process, the second inorganic barrier layer 214c may be deposited to have a thickness of approximately 300 to 500 Å. However, the thickness may be reduced or increased to a predetermined level depending on the process or the environment.

Here, as illustrated in FIG. 7C, the organic barrier pattern 214b formed in the second area A2 on the first inorganic barrier layer 214a is formed to have at least one round shape. Therefore, in the second inorganic barrier layer 214c on the organic barrier pattern 214b, at least one round shape is reflected as it is in the second area A2. When the first electrode 115 is directly formed on the round barrier layer, the defect may be caused between the barrier layer and the organic light emitting diode, thereby degrading the reliability of the lighting apparatus.

Figure 7D:
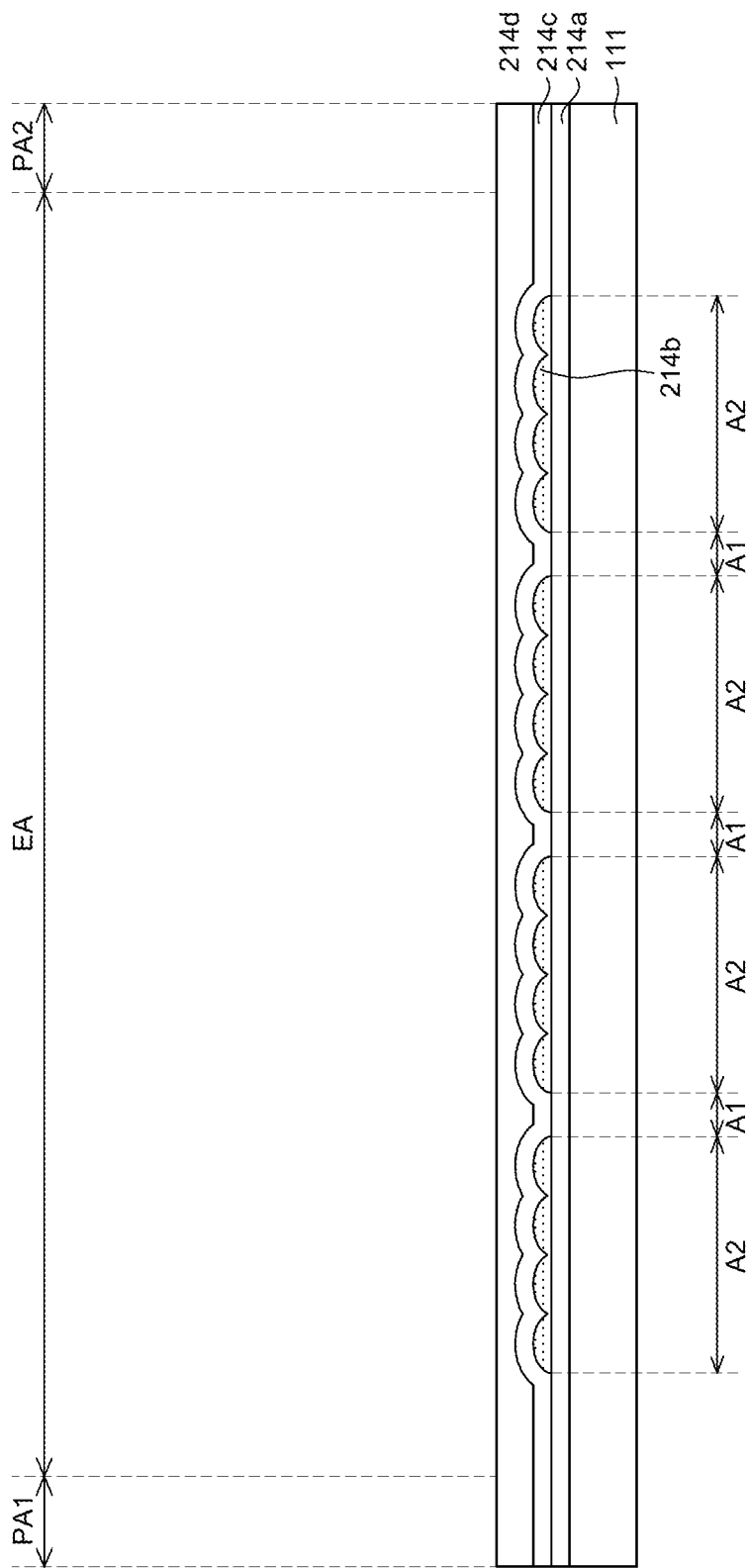

Therefore, as illustrated in FIG. 7D, in order to solve the problem of the surface uniformity degradation, the barrier planarizing layer 214d is formed on the second inorganic barrier layer 214c to planarize the barrier layer.

Specifically, the barrier planarizing layer 214d needs to be configured by a material which can be subjected to a soluble process to planarize the barrier layer. As described above, when the barrier planarizing layer 214d is formed by an organic layer, a movement path of the permeated moisture is provided. Therefore, the planarizing layer needs to be formed of an inorganic layer.

Therefore, the barrier planarizing layer 214d may be formed by spin-coating siloxane or silazane which is an inorganic material which is subjected to a soluble process, on the second inorganic barrier layer 214c to which at least one round shape is reflected.

Figure 7E:
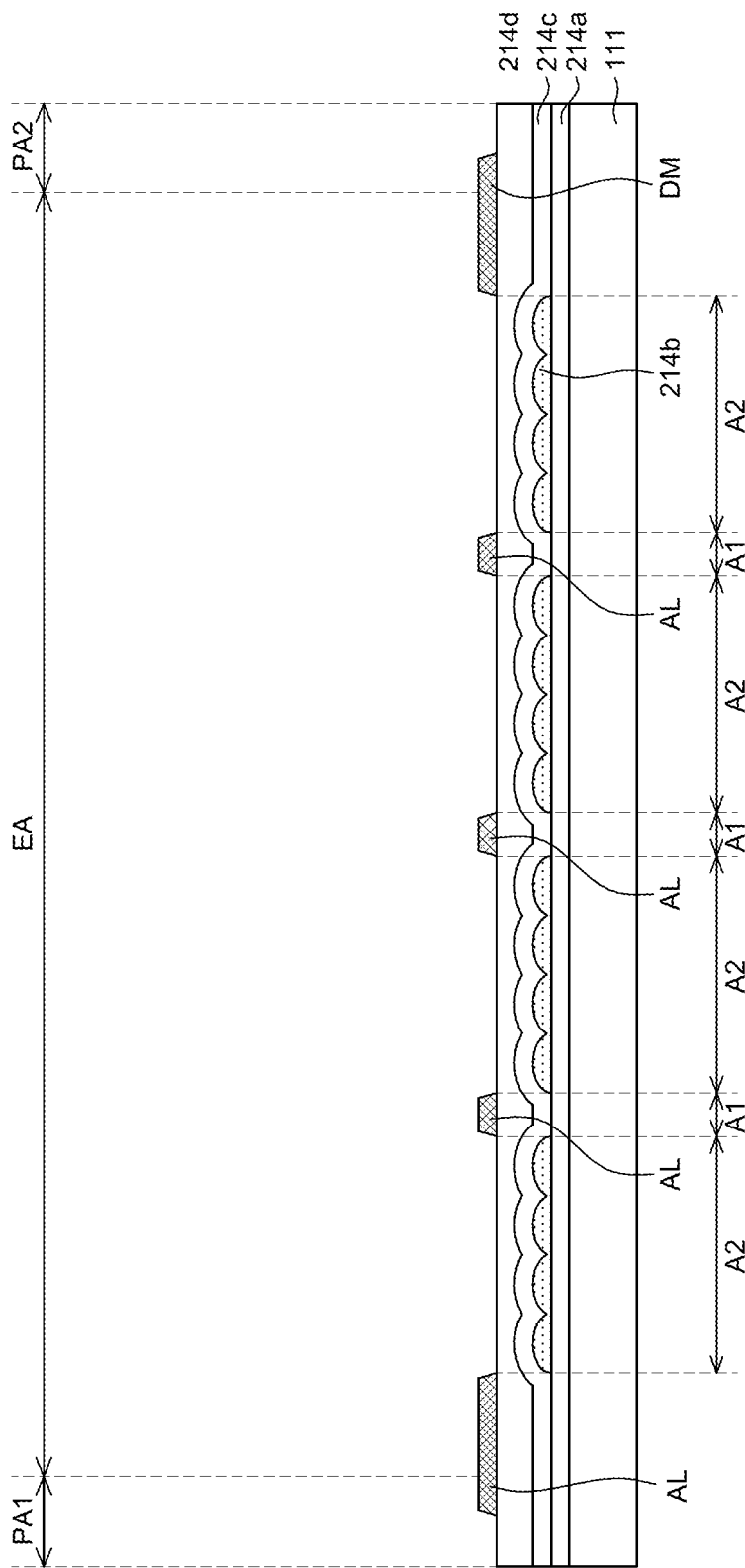

Next, referring to FIG. 7E, the auxiliary line AL and the dummy electrode DM are formed in the first area A1 on the substrate 111 on which the barrier planarizing layer 214d is deposited.

Here, the auxiliary line AL and the dummy electrode DM may be formed of the same material on the same layer by the same process. Specifically, the dummy electrode DM may be partially formed in the second pad unit PA2 to be connected to the second contact electrode 117p which will be described below.

Even though not specifically illustrated, a single stack or multi-stack conductive layer of a metal having a good conductivity such as aluminum (Al), gold (Au), copper (Cu), titanium (Ti), tungsten (W), molybdenum (Mo), or an alloy thereof is formed on the entire surface of the substrate 111 on which the second inorganic barrier layer 214c is formed. Thereafter, after forming a photo mask only in the second area A2, the laminated conductive layer is etched to form the auxiliary line AL and the dummy electrode DM to be disposed in the first area A1.

Figure 7F:
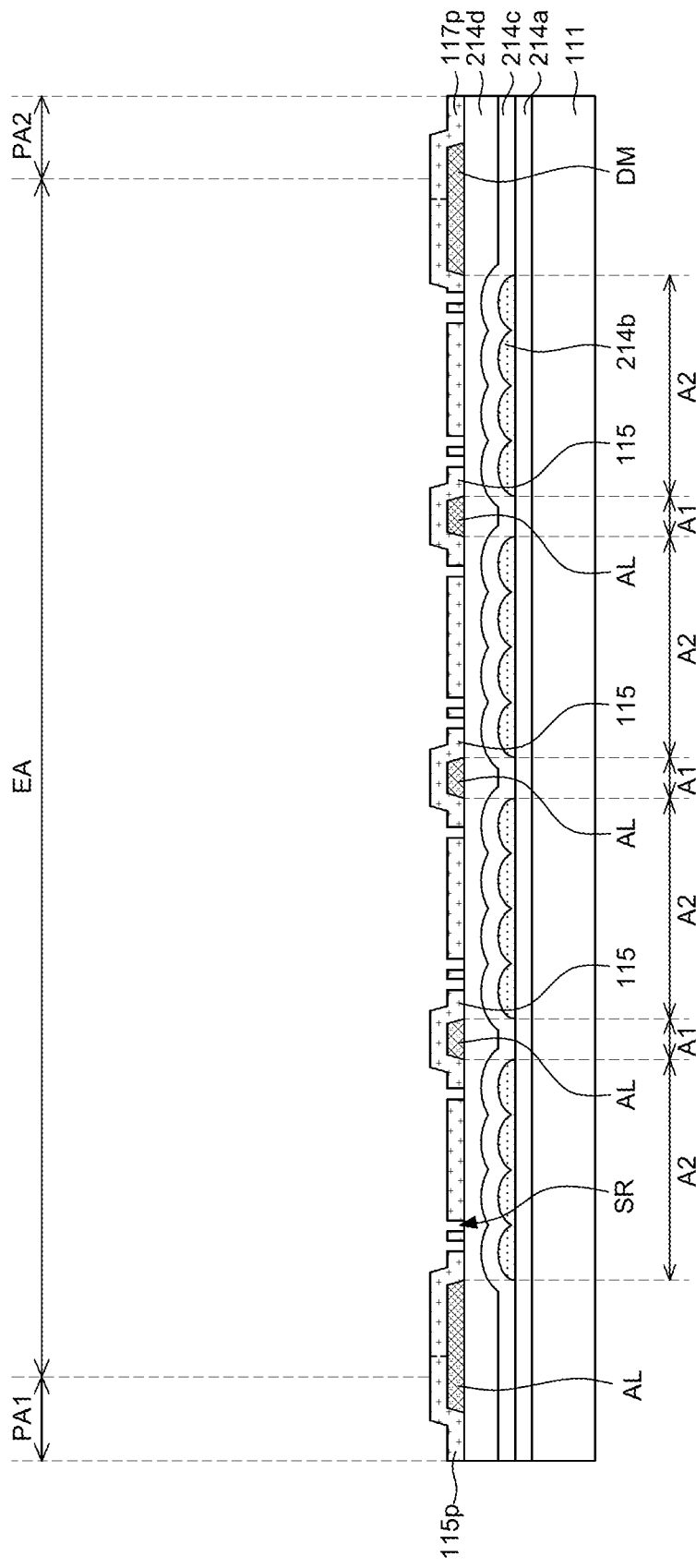

Next, referring to FIG. 7F, an oxide material such as indium tin oxide (ITO) or indium zinc oxide (IZO) or a thin metal film is deposited to be patterned to form the first electrode 115, the first contact electrode 115p, and the second contact electrode 117p. Here, a specific example of the thin metal film may be configured by a metal such as magnesium (Mg), calcium (Ca), sodium (Na), titanium (Ti), indium (In), yttrium (Y), lithium (Li), gadolinium (Gd), aluminum (Al), silver (Ag), tin (Sn) and lead (Pb), or an alloy thereof. The first electrode 115 may be configured by a single stack or may also be configured by a multi-stack configured by the above-mentioned materials.

Specifically, as described above, in the first electrode 115 formed in the lighting unit EA, a short reduction pattern SR which implements a narrow path at the outer edge of the second area A2 may be formed.

Further, the first contact electrode 115p is formed in the first pad unit PA1 to be electrically connected to the first electrode 115 and the auxiliary line AL. The second contact electrode 117p is formed in the second pad unit PA2 to be electrically shorted from the first electrode 115 and the auxiliary line AL and be electrically connected to the dummy electrode DM.

Figure 7G:
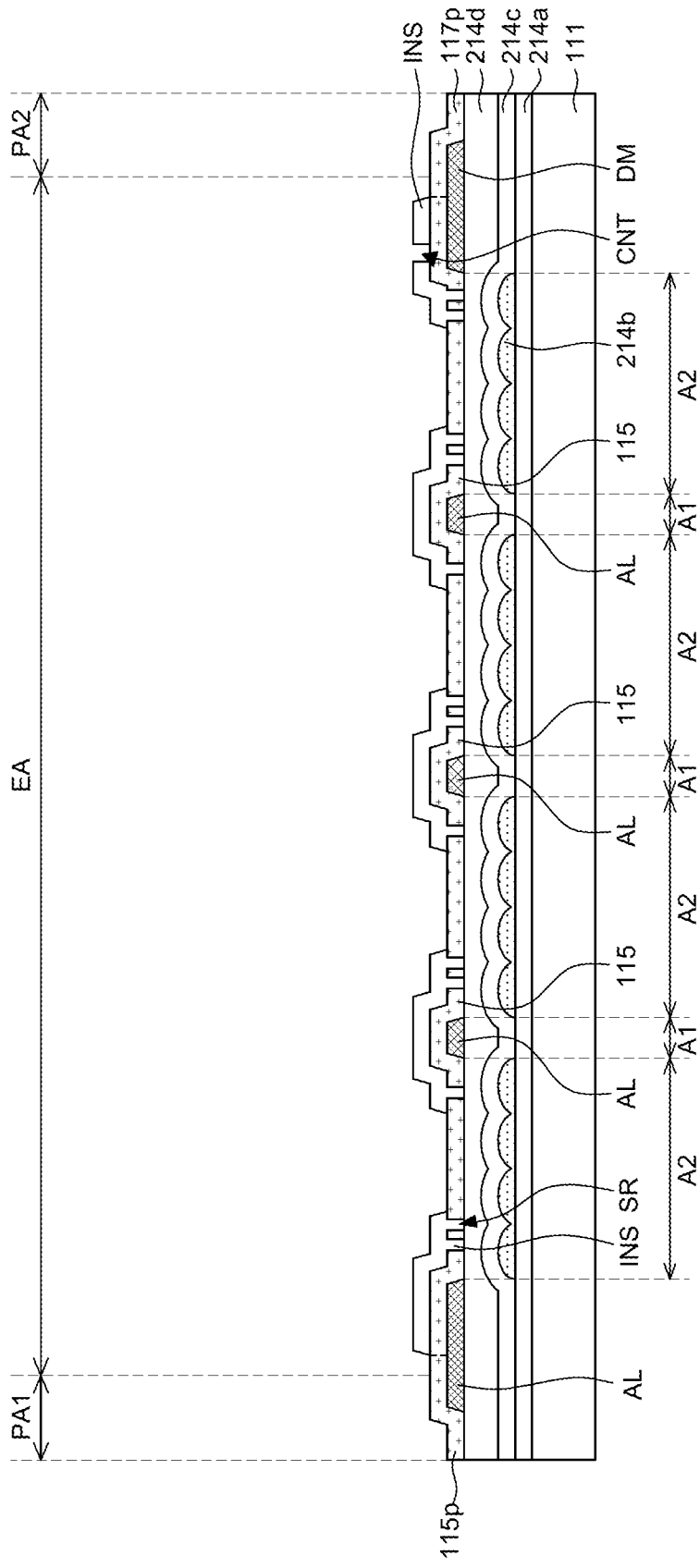

Next, referring to FIG. 7G, the insulating layer INS is formed on the first electrode 115 on which the short reduction pattern SR is formed.

Further, the insulating layer INS is formed in the entire first area A1 to be divided into a plurality of insulating layers to cover the short reduction pattern SR formed in the second area A2.

Further, for the purpose of the contact of the second electrode 117 and the second contact electrode 117p formed by the post process, the insulating layer INS disposed in the lighting unit EA adjacent to the second pad unit PA2 may be formed to include a contact hole CNT.

Here, the insulating layer INS may be formed by an inorganic material such as silicon oxide SiOx or silicon nitride SiNx. However, the insulating layer INS may be formed by an organic layer such as photoacryl (PAC) and also formed by a plurality of layers of inorganic layers and organic layers.

Figure 7H:
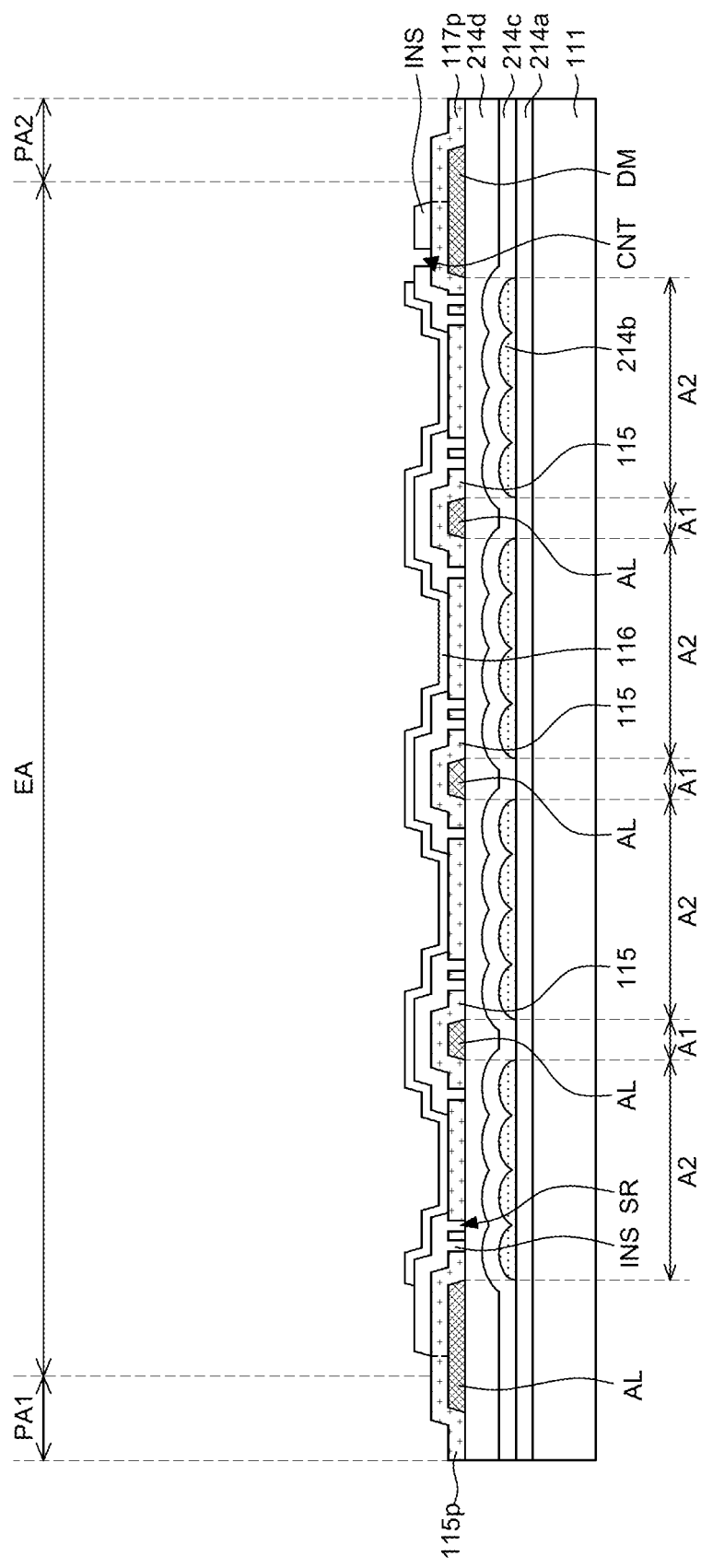

Next, referring to FIG. 7H, the organic layer 116 is formed on the entire surface of the substrate 111 on which the insulating layer INS and the first electrode 115 are formed.

The organic layer 116 may be configured by a single stack structure including a red organic light emitting layer EML or formed to have a multi-stack tandem structure including a plurality of red organic light emitting layers, or a multi-stack tandem structure including a red-green organic light emitting layer EML and a sky blue organic light emitting layer EML.

Specifically, the organic layer 116 which is disposed in the second area A2 and abuts against the first electrode 115 is applied with current to emit light. In contrast, an organic layer 116 which is disposed in the first area A1 and abuts against the insulating layer INS is not applied with the current so that the light is not emitted.

Figure 7I:
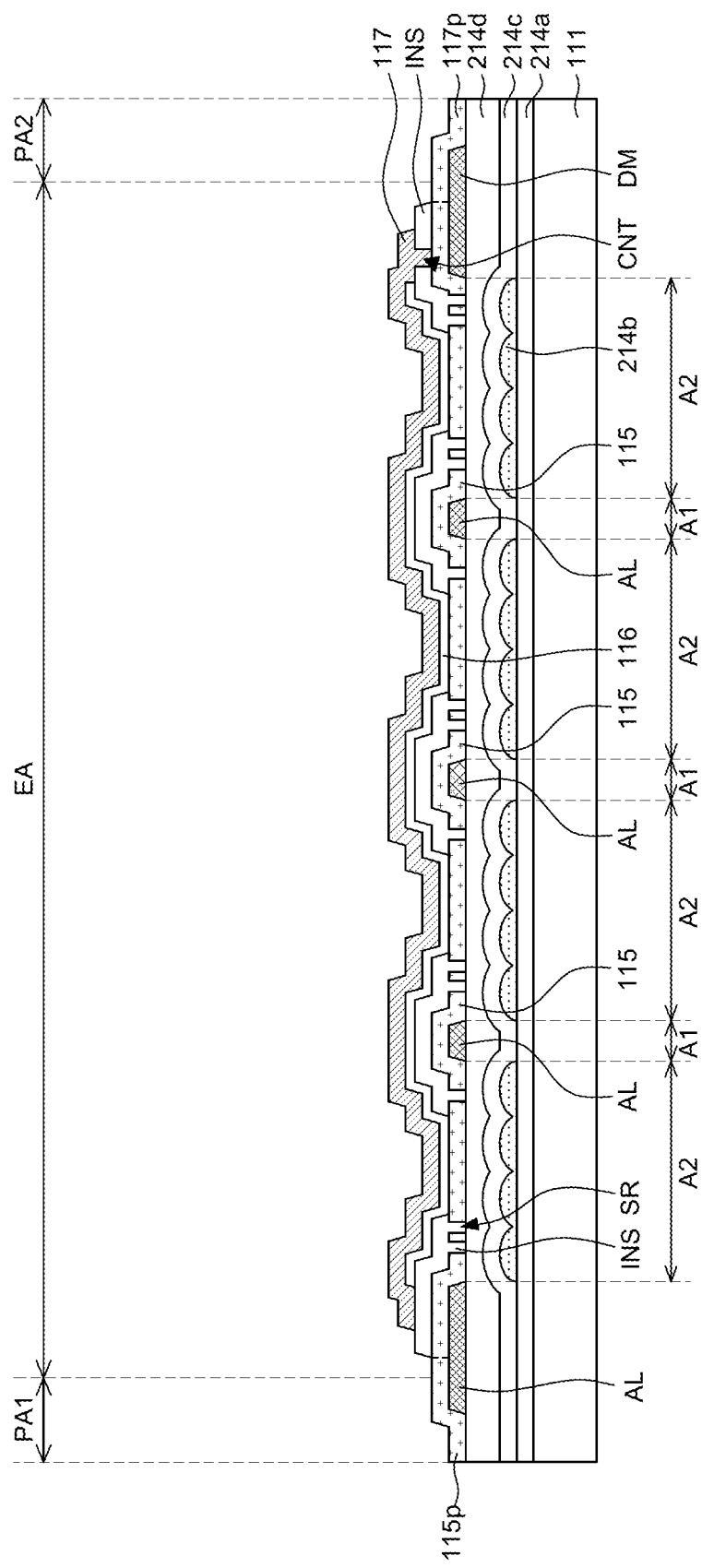

Next, referring to FIG. 7I, the second electrode 117 is deposited so as to cover the plurality of organic layers 116.

The second electrode 117 may be formed of a metal such as magnesium (Mg), calcium (Ca), sodium (Na), titanium (Ti), indium (In), yttrium (Y), lithium (Li), gadolinium (Gd), aluminum (Al), silver (Ag), tin (Sn) and lead (Pb), or an alloy thereof. Further, the second electrode 117 may be formed as a single stack or also formed as a multi-stack configured by the above-mentioned material. One side of the second electrode 117 is formed to be electrically connected to the second contact electrode 117p.

Figure 7J:
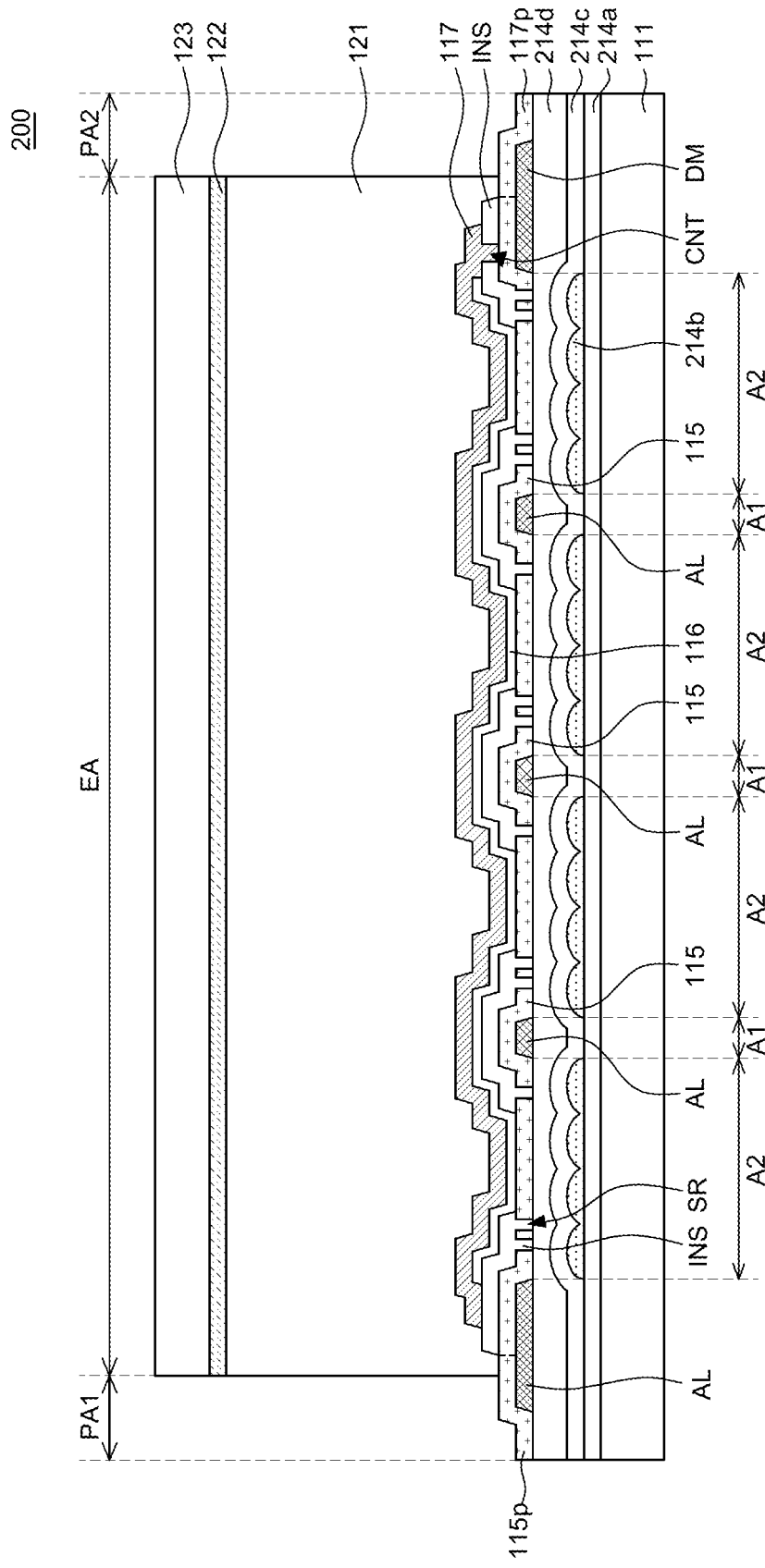

Next, referring to FIG. 7J, on the entire surface of the lighting unit of the substrate 111 excluding the first and second pad units PA1 and PA2, a pressure sensitive adhesive (PSA) layer 121, the metal film 122, and a protective film 123 are formed. Further, a pressure is applied to the metal film 122 and the protective film 123 from the upper portion to the lower portion to attach the metal film 122 and the protective film 123 to each other, thereby completing the lighting apparatus.

The exemplary disclosures of the present disclosure can also be described as follows:

According to an aspect of the present disclosure, a lighting apparatus using an organic light emitting diode is divided into a first area and a second area and includes: a substrate; a barrier layer disposed on the substrate; an auxiliary line disposed in a first area on the substrate on which the barrier layer is disposed; a first electrode disposed on an entire surface of a substrate on which the barrier layer and the auxiliary line are disposed; an organic layer disposed on the first electrode; and a second electrode disposed on the organic layer, in which the barrier layer includes a first inorganic barrier layer, an organic barrier pattern disposed in the second area, and a second inorganic barrier layer. Therefore, the reliability of the lighting apparatus may be improved.

The first inorganic barrier layer and the second inorganic barrier layer may surround the organic barrier pattern.

A thickness of the organic barrier pattern may be thicker than a thickness of any one of the first inorganic barrier layer and the second inorganic barrier layer.

The organic barrier pattern may be made of photoacryl (PAC).

The organic barrier pattern may have a round shape.

The lighting apparatus using an organic light emitting diode may further comprise a barrier planarizing layer disposed on the round organic barrier pattern.

The barrier planarizing layer may be made of siloxane or silazane.

The first electrode may include a short reduction pattern which implements a narrow path at an outer edge of the second area.

The lighting apparatus using an organic light emitting diode may further comprise an insulating layer which covers the first electrode and the auxiliary line.

The lighting apparatus using an organic light emitting diode may further comprise a first contact electrode which is electrically connected to the first electrode and is exposed to the outside in a first pad unit, and a second contact electrode which is electrically connected to the second electrode and is exposed to the outside in a second pad unit.

According to another aspect of the present disclosure, a manufacturing method of a lighting apparatus using an organic light emitting diode includes: providing a substrate which is divided into a first area and a second area; depositing a first inorganic barrier layer on the substrate; forming an organic barrier pattern in the second area on the substrate on which the first inorganic barrier layer is deposited; depositing a second inorganic barrier layer on an entire surface of the substrate on which the organic barrier pattern is formed; forming an auxiliary line in the first area on the substrate on which the second inorganic barrier layer is deposited; forming a first electrode on an entire surface of the substrate on which the second inorganic barrier layer and the auxiliary line are disposed; depositing an organic layer on an entire surface of the substrate on which the first electrode is formed; and depositing a second electrode on an entire surface of the substrate on which the organic layer is formed. Therefore, it is possible to manufacture a lighting apparatus with an improved external moisture-proofing function.

The forming of an organic barrier pattern may include forming a second inorganic barrier pattern in the first area on the substrate on which the first inorganic barrier layer is deposited; and forming the organic barrier pattern between the second inorganic barrier patterns on the substrate on which the first inorganic barrier layer is deposited.

The forming of an organic barrier pattern may include causing a surface of the first inorganic barrier layer to have hydrophobicity and forming the organic barrier pattern in the second area on the substrate on which the first inorganic barrier layer is deposited, using an inkjet method.

The manufacturing method may further comprise after the depositing of a second inorganic barrier layer, forming a barrier planarizing layer on the second inorganic barrier layer by a spin-coating method.

Although the exemplary disclosures of the present disclosure have been described in detail with reference to the accompanying drawings, the present disclosure is not limited thereto and may be embodied in many different forms without departing from the technical concept of the present disclosure. Therefore, the exemplary disclosures of the present disclosure are provided for illustrative purposes only but not intended to limit the technical concept of the present disclosure. The scope of the technical concept of the present disclosure is not limited thereto. Therefore, it should be understood that the above-described exemplary disclosures are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A lighting apparatus using an organic light emitting diode that has a first area and a second area, the lighting apparatus comprising:
   a substrate;
   a barrier layer disposed on the substrate;
   an auxiliary line disposed in the first area on the substrate;
   a first electrode disposed on an entire surface of the substrate;
   an organic layer disposed on the first electrode; and
   a second electrode disposed on the organic layer,
   wherein the barrier layer includes a first inorganic barrier layer, an organic barrier pattern disposed in the second area, and a second inorganic barrier layer, and
   wherein the organic barrier pattern comprises a plurality of domes having a length corresponds to a distance between two adjacent auxiliary lines.

2. The lighting apparatus using an organic light emitting diode according to claim 1, wherein the first inorganic barrier layer and the second inorganic barrier layer surround the organic barrier pattern.

3. The lighting apparatus using an organic light emitting diode according to claim 1, wherein a thickness of the organic barrier pattern is greater than a thickness of the first inorganic barrier layer, and
   wherein the thickness of the organic barrier pattern is greater than a thickness of the second inorganic barrier layer.

4. The lighting apparatus using an organic light emitting diode according to claim 1, wherein the organic barrier pattern is made of photoacryl (PAC).

5. The lighting apparatus using an organic light emitting diode according to claim 1, wherein the plurality of domes have around shape.

6. The lighting apparatus using an organic light emitting diode according to claim 5, further comprising a barrier planarizing layer disposed on the plurality of domes.

7. The lighting apparatus using an organic light emitting diode according to claim 6, wherein the barrier planarizing layer is made of siloxane or silazane.

8. The lighting apparatus using an organic light emitting diode according to claim 1, wherein the first electrode includes a short reduction pattern which implements a narrow path at an outer edge of the second area.

9. The lighting apparatus using an organic light emitting diode according to claim 1, further comprising an insulating layer which covers the first electrode and the auxiliary line.

10. The lighting apparatus using an organic light emitting diode according to claim 1, further comprising:

a first contact electrode which is electrically connected to the first electrode and is exposed to outside in a first pad unit, and a second contact electrode which is electrically connected to the second electrode and is exposed to outside in a second pad unit.

11. A lighting apparatus using an organic light emitting diode that has a first area and a second area, the lighting apparatus comprising:

a substrate;

a barrier layer disposed on the substrate;

an auxiliary line disposed in the first area on the substrate;

a first electrode disposed on an entire surface of the substrate and including a short reduction pattern which implements a narrow path at an outer edge of the second area;

an organic layer disposed on the first electrode; and a second electrode disposed on the organic layer, wherein the barrier layer includes a first inorganic barrier layer, an organic barrier pattern disposed in the second area only, and a second inorganic barrier layer, and wherein the organic barrier pattern comprises a plurality of domes having a length corresponds to a distance between two adjacent auxiliary lines.

12. The lighting apparatus using an organic light emitting diode according to claim 11, wherein the first inorganic barrier layer and the second inorganic barrier layer surround the organic barrier pattern.

13. The lighting apparatus using an organic light emitting diode according to claim 11, wherein a thickness of the organic barrier pattern is greater than a thickness of the first inorganic barrier layer, and wherein the thickness of the organic barrier pattern is greater than a thickness of the second inorganic barrier layer.

14. The lighting apparatus using an organic light emitting diode according to claim 11, wherein the organic barrier pattern is made of photoacryl (PAC).

15. The lighting apparatus using an organic light emitting diode according to claim 11, wherein the plurality of domes have a round shape.

* * * * *